US011496151B1

(12) United States Patent
Wang et al.

(10) Patent No.: US 11,496,151 B1
(45) Date of Patent: Nov. 8, 2022

(54) NEURAL NETWORK MODEL COMPRESSION WITH BLOCK PARTITIONING

(71) Applicant: TENCENT AMERICA LLC, Palo Alto, CA (US)

(72) Inventors: Wei Wang, Palo Alto, CA (US); Wei Jiang, San Jose, CA (US); Shan Liu, San Jose, CA (US)

(73) Assignee: TENCENT AMERICA LLC, Palo Alto, CA (US)

( * ) Notice: Subject to any disclaimer, the term of this patent is extended or adjusted under 35 U.S.C. 154(b) by 8 days.

(21) Appl. No.: 17/232,069

(22) Filed: Apr. 15, 2021

Related U.S. Application Data

(60) Provisional application No. 63/079,706, filed on Sep. 17, 2020, provisional application No. 63/079,310, filed on Sep. 16, 2020, provisional application No. 63/042,303, filed on Jun. 22, 2020, provisional application No. 63/015,213, filed on Apr. 24, 2020.

(51) Int. Cl.
*H03M 7/30* (2006.01)
*G06N 3/02* (2006.01)

(52) U.S. Cl.
CPC ............ *H03M 7/6005* (2013.01); *G06N 3/02* (2013.01); *H03M 7/3064* (2013.01); *H03M 7/3079* (2013.01)

(58) Field of Classification Search
CPC ............. H03M 7/6005; H03M 7/3064; H03M 7/3079; G06N 3/02
See application file for complete search history.

(56) References Cited

U.S. PATENT DOCUMENTS

| 5,875,108 A * | 2/1999 | Hoffberg .......... H04N 21/44224 |
| | | 700/83 |
| 7,136,710 B1 * | 11/2006 | Hoffberg ................ G16H 40/67 |
| | | 700/83 |

(Continued)

OTHER PUBLICATIONS

International Search Report and Written Opinion dated Oct. 4, 2021 in International Application No. PCT/US 21/27926, 16 pgs.

(Continued)

*Primary Examiner* — Lam T Mai
(74) *Attorney, Agent, or Firm* — ArentFox Schiff LLP

(57) ABSTRACT

An apparatus of neural network model decompression includes processing circuitry. The processing circuitry can be configured to receive, from a bitstream of a compressed neural network representation, one or more first syntax elements associated with a 3-dimensional coding unit (CU3D) partitioned from a 3-dimensional coding tree unit (CTU3D). The first CTU3D can be partitioned from a tensor in a neural network. The one or more first syntax elements can indicate that the CU3D is partitioned based on a 3D pyramid structure that includes multiple depths. Each depth corresponds to one or more nodes. Each node has a node value. Second syntax elements corresponding to the node values of the nodes in the 3D pyramid structure can be received from the bitstream in a breadth-first scan order for scanning the nodes in the 3D pyramid structure. Model parameters of the tensor can be reconstructed based on the received second syntax elements.

28 Claims, 17 Drawing Sheets

(56) References Cited

U.S. PATENT DOCUMENTS

| | | | |
|---|---|---|---|
| 7,269,292 B2 * | 9/2007 | Steinberg | H04N 19/136 348/222.1 |
| 7,315,630 B2 * | 1/2008 | Steinberg | H04N 5/23248 348/E5.038 |
| 7,317,815 B2 * | 1/2008 | Steinberg | G06K 9/00 382/199 |
| 7,362,368 B2 * | 4/2008 | Steinberg | H04N 5/2353 348/E5.037 |
| 7,440,593 B1 * | 10/2008 | Steinberg | G06K 9/00 348/207.99 |
| 7,471,846 B2 * | 12/2008 | Steinberg | G06K 9/00 348/169 |
| 7,574,016 B2 * | 8/2009 | Steinberg | G06V 10/30 348/169 |
| 7,616,233 B2 * | 11/2009 | Steinberg | H04N 5/2353 348/333.03 |
| RE46,310 E * | 2/2017 | Hoffberg | H04N 21/252 |
| 10,361,802 B1 * | 7/2019 | Hoffberg-Borghesani | G06F 3/00 |
| RE47,908 E * | 3/2020 | Hoffberg | H04N 21/4532 |
| RE48,056 E * | 6/2020 | Hoffberg | G05B 19/42 |
| 10,674,152 B2 * | 6/2020 | Coelho | H04N 19/96 |
| 10,869,036 B2 * | 12/2020 | Coelho | H04N 19/119 |
| 11,025,907 B2 * | 6/2021 | Li | G06N 3/0454 |
| 2006/0155398 A1 * | 7/2006 | Hoffberg | G06V 40/103 700/86 |
| 2013/0083857 A1 | 4/2013 | Zheng et al. | |
| 2014/0254682 A1 | 9/2014 | Chen et al. | |
| 2018/0247180 A1 | 8/2018 | Cheng et al. | |
| 2019/0238893 A1 * | 8/2019 | Covell | H04N 19/13 |
| 2020/0186809 A1 * | 6/2020 | Mukherjee | G06T 9/002 |

OTHER PUBLICATIONS

Simon Wiedemann et al. "DeepCABAC: A Universal Compression Algorithm for Deep Neural Networks." In: Cornell University library/Computer Science/Machine Learning, Jul. 27, 2019, [online] [retrieved on Aug. 29, 2021 (Aug. 29, 2021 )] Retrieved from the Internet< URL: https://arxiv.org/abs/1907.11900 >, entire document, 18 pgs.

Dingheng Wang et al. "Lossless Compression for Redundant 3DCNNs Based on Tensor Train Decomposition." In: Cornell University Library/ Computer Science/ Computer Vision and Pattern Recognition, Dec. 8, 2019, [online] [retrieved on Aug. 29, 2021 (Aug. 29, 2021)] Retrieved from the Internet< URL: https://arxiv.org/abs/1912.03647 >, entire document, 15 pgs.

* cited by examiner

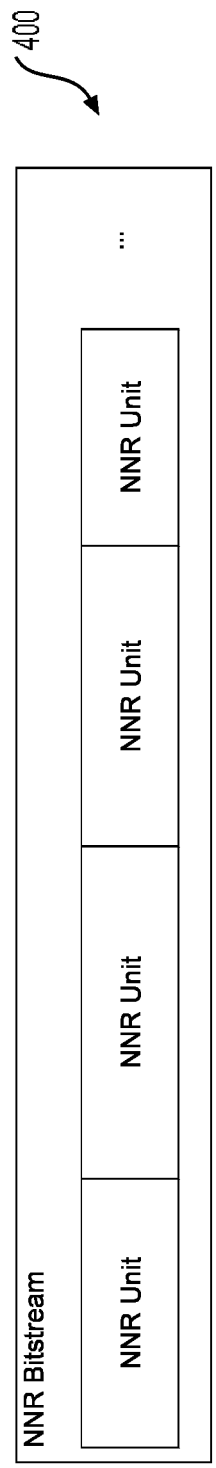

| nmr_unit_header() { | Descriptor |
|---|---|
| nmr_unit_type | u(8) |
| if( nmr_unit_type == NNR_MPS ) | |
| nmr_model_parameter_set_unit_header() | |
| if( nmr_unit_type == NNR_LPS ) | |
| nmr_layer_parameter_set_unit_header() | |
| if( nmr_unit_type == NNR_TPL ) | |
| nmr_topology_unit_header() | |
| if( nmr_unit_type == NNR_QNT ) | |
| nmr_quanization_unit_header() | |
| if( nmr_unit_type == NNR_NDU ) | |
| nmr_compressed_data_unit_header() | |
| if( nmr_unit_type == NNR_STR ) | |
| nmr_start_unit_header() | |
| if( nmr_unit_type == NNR_AGG ) | |
| nmr_aggregate_unit_header() | |
| } | |

*FIG. 6*

| | Descriptor |
|---|---|
| nnr_aggregate_unit_header( ) { | |
|   nnr_aggregate_unit_type | u(8) |
|   entry_points_present_flag | u(1) |
|   nnr_reserved_zero_7bits | u(7) |
|   num_of_nnr_units_minus2 | u(16) |
|   if( entry_points_present_flag ) { | |
|     for( i = 0; i < num_of_nnr_units_minus2 + 2; i++ ) { | |
|       nnr_unit_type[ i ] | u(8) |
|       nnr_unit_entry_point[ i ] | u(16) |
|     } | |
|   if ( nnr_aggregate_unit_type = = NNR_AGG_XYZ_1 \|\| nnr_aggregate_unit_type = = NNR_AGG_XYZ_2 ) { | |
|     for( i = 0; i < num_of_nnr_units_minus2 + 2; i++ ) { | |
|       delta_quantization_step_size[ i ] | flt(32) |
|     } | |
|   } | |
| } | |

FIG. 7

| nnr_unit_payload() { | Descriptor |
|---|---|
| if( nnr_unit_type = = = NNR_MPS ) | |
| nnr_model_parameter_set_payload() | |
| if( nnr_unit_type = = NNR_LPS ) | |
| nnr_layer_parameter_set_payload() | |
| if( nnr_unit_type = = NNR_TPL ) | |
| nnr_topology_unit_payload() | |
| if( nnr_unit_type = = NNR_QNT ) | |
| nnr_quanization_unit_payload() | |
| if( nnr_unit_type = = NNR_NDU ) | |
| nnr_compressed_data_unit_payload() | |
| if( nnr_unit_type = = NNR_STR ) | |
| nnr_start_unit_payload() | |
| if( nnr_unit_type = = NNR_AGG ) | |
| nnr_aggregate_unit_payload() | |
| } | |

FIG. 8

| nnr_model_parameter_set_payload() { | Descriptor |
|---|---|
| quantization_step_size | flt(32) |
| } | |

FIG. 9

| nnr_model_parameter_set_payload() { | Descriptor |
|---|---|
| quantization_step_size | flt(32) |
| ctu_partition_flag | u(1) |
| if(ctu_partition_flag){ | |
|   max_ctu_dim_flag | u(2) |
|   nnr_reserved_zero_5bits | u(5) |
| }else{ | |
|   nnr_reserved_zero_7bits | u(7) |
| } | |
| } | |

*FIG. 10*

| | Descriptor |
|---|---|
| nnr_aggregate_unit_header( ) { | |
|   nnr_aggregate_unit_type | u(8) |
|   entry_points_present_flag | u(1) |
|   nnr_reserved_zero_7bits | u(7) |
|   num_of_nnr_units_minus2 | u(16) |
|   if( entry_points_present_flag ) { | |
|     for( i = 0; i < num_of_nnr_units_minus2 + 2; i++) { | |
|       nnr_unit_type[ i ] | u(8) |
|       nnr_unit_entry_point[ i ] | u(16) |
|     } | |
|   } | |
|   if( nnr_aggregate_unit_type == NNR_AGG_XYZ_1 \|\| nnr_aggregate_unit_type == NNR_AGG_XYZ_2 ) { | |
|     for( i = 0; i < num_of_nnr_units_minus2 + 2; i++) { | |
|       delta_quantization_step_size[i] | flt(32) |
|       quant_bitdepth[i] | u(5) |
|       if(ctu_partition_flag){ | |
|         ctu_scan_order[i] | u(1) |
|         nnr_reserved_zero_2bits | u(2) |
|       }else{ | |
|         nnr_reserved_zero_3bits | u(3) |
|       } | |
|     } | |

*FIG. 11*

```
quant_tensor( dimensions, maxNumNoRem ) {
    stateId = 0
    for( i = 0; i < Prod( dimensions ); i++ ) {
        idx = TensorIndex( dimensions, i )
        int_param( idx, maxNumNoRem, stateId )
        if(dq_flag) {
            nextSt = StateTransTab[stateId][QuantParam[idx] & 1]
            if( QuantParam[idx] != 0 ) {
                QuantParam[idx]  = QuantParam[idx] << 1
                QuantParam[idx] += QuantParam[idx] < 0 ? ( stateId & 1 ) : -( stateId & 1 )
            }
            stateId = nextSt
        }
    }
}
```

*FIG. 12*

| | descriptor |
|---|---|
| quant_weight( i, maxNumNoRem ) { | |
|   QuantWeight[i] = 0 | |
|   sig_flag | ae(v) |
|   if( sig_flag ) { | |
|     QuantWeight[i]++ | |
|     sign_flag | ae(v) |
|     j = -1 | |
|     do { | |
|       j++ | |
|       abs_level_greater_x[j] | ae(v) |
|       QuantWeight[i] += abs_level_greater_x[j] | |
|     } while( abs_level_greater_x[j] == 1 && j < maxNumNoRem ) | |
|     if( j == maxNumNoRem ) { | |
|       RemBits = 0 | |
|       j = -1 | |
|       do { | |
|         j++ | |
|         abs_level_greater_x2[j] | ae(v) |
|         if( abs_level_greater_x2[j] ) { | |
|           RemBits++ | |
|           QuantWeight[i] += 1 << RemBits | |
|         } | |
|       } while( abs_level_greater_x2[j] ) | |
|       abs_remainder | uab(RemBits) |
|       QuantWeight[i] += abs_remainder | |
|     } | |
|     QuantWeight[i] = sign_flag ?-QuantWeight[i] : QuantWeight[i] | |
|   } | |
| } | |

NEURAL NETWORK MODEL COMPRESSION WITH BLOCK PARTITIONING

INCORPORATION BY REFERENCE

This present disclosure claims the priority to U.S. Provisional Application No. 63/015,213, "Block Definition and Usage for Neural Network Model Compression" filed on Apr. 24, 2020, No. 63/042,303, "3D Pyramid Coding Method for Neural Network Model Compression" filed on Jun. 22, 2020, No. 63/079,310, "Unification Based Coding Method for Neural Network Model Compression" filed on Sep. 16, 2020, and No. 63/079,706, "Unification based Coding Method for Neural Network Model Compression" filed on Sep. 17, 2020. The disclosures of the prior applications are hereby incorporated by reference in their entirety.

TECHNICAL FIELD

The present disclosure describes embodiments generally related to neural network model compression/decompression.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Various applications in the fields of computer vision, image recognition, and speech recognition rely on neural networks to achieve performance improvements. A neural network is based on a collection of connected nodes (also referred to as neurons), which loosely model the neurons in a biological brain. The neurons can be organized into multiple layers. Neurons of one layer can connect to neurons of the immediately preceding and immediately following layers.

A connection between two neurons, like the synapses in a biological brain, can transmit a signal from one neuron to the other neuron. A neuron that receives a signal then processes the signal and can signal other connected neurons. In some examples, to find the output of a neuron, inputs to the neuron are weighted by the weights of the connections from the inputs to the neuron, and the weighted inputs are summed to generate a weighted sum. A bias may be added to the weighted sum. Further, the weighted sum is then passed through an activation function to produce the output.

SUMMARY

Aspects of the disclosure provide methods and apparatuses of neural network model compression/decompression. In some examples, an apparatus of neural network model decompression includes processing circuitry. The processing circuitry can be configured to receive a first syntax element in a compressed neural network representation (NNR) aggregate unit header of an NNR aggregate unit from a bitstream of a compressed neural network representation of a neural network. The first syntax element can indicate a coding tree unit (CTU) scan order for processing a tensor in the NNR aggregate unit. The tensor in the NNR aggregate unit can be reconstructed based on the CTU scan order indicated by the first syntax element.

In an embodiment, a first value of the first syntax element can indicate that the CTU scan order is a first raster scan order at a horizontal direction, and a second value of the first syntax element indicates that the CTU scan order is a second raster scan order at a vertical direction. In an embodiment, a second syntax element in the NNR aggregate unit header of the NNR aggregate unit can be received from the bitstream. The second syntax element can indicate a maximum bit depth of quantized coefficients for the tensor in the NNR aggregate unit.

In an embodiment, a third syntax element indicating whether a CTU block partitioning is enabled for the tensor in the NNR aggregate unit can be received. The third syntax element can be a model-wise syntax element to specify whether the CTU block partitioning is enabled for layers of the neural network, or a tensor-wise syntax element to specify whether the CTU block partitioning is enabled for the tensor in the NNR aggregate unit.

In an embodiment, a model-wise or tensor-wise fourth syntax element indicating a CTU dimension for the tensor in the NNR aggregate unit can be received. In an embodiment, an NNR unit can be received before receiving any NNR aggregate units. The NNR unit can include a fifth syntax element indicating whether CTU partitioning is enabled.

In some examples, another apparatus of neural network model decompression includes processing circuitry. The processing circuitry can be configured to receive, from a bitstream of a compressed neural network representation, one or more first syntax elements associated with a 3-dimensional coding unit (CU3D) partitioned from a first 3-dimensional coding tree unit (CTU3D). The first CTU3D can be partitioned from a tensor in a neural network. The one or more first syntax elements can indicate that the CU3D is partitioned based on a 3D pyramid structure that includes multiple depths. Each depth corresponds to one or more nodes. Each node has a node value. Second syntax elements corresponding to the node values of the nodes in the 3D pyramid structure can be received from the bitstream in a breadth-first scan order for scanning the nodes in the 3D pyramid structure. Model parameters of the tensor can be reconstructed based on the received second syntax elements corresponding to the node values of the nodes in the 3D pyramid structure. In various embodiments, the 3D pyramid structure is one of an octree structure, a unitree structure, a tagtree structure, or a unitagtree structure.

In an embodiment, the receiving of the second syntax elements starts from a start depth of the depths of the 3D pyramid structure. The start depth can be indicated in the bitstream or inferred at the decoder. In an embodiment, a third syntax element can be received that indicates a start depth for the receiving of the second syntax elements indicating the node values of the nodes in the 3D pyramid structure. When the start depth is the last depth of the 3D pyramid structure, the model parameters of the tensor can be decoded from the bitstream using a non-3D-pyramid-tree-based decoding method.

In an embodiment, a third syntax element can be received that indicate a start depth for the receiving of the second syntax elements indicating the node values of the nodes in the 3D pyramid structure. When the start depth is the last depth of the 3D pyramid structure, the receiving the second syntax elements starts from the second last depth of the depths of the 3D pyramid structure.

In another embodiment, a third syntax element can be received that indicates a start depth for the receiving of the second syntax elements indicating the node values of the nodes in the 3D pyramid structure. When the start depth is the last depth of the 3D pyramid structure and the 3D pyramid structure is a unitagtree structure associated with unitree part encoding and tagtree part encoding, for the unitree part encoding, the receiving the second syntax elements starts from the second last depth of the depths of the 3D pyramid structure; and, for the tagtree part encoding, the receiving the second syntax elements starts from the last depth of the depths of the 3D pyramid structure.

In an embodiment, dependent quantization is disabled when the one or more first syntax elements indicate that the CU3D is partitioned based on the 3D pyramid structure. In an embodiment, a dependent quantization construction process can be performed when the one or more first syntax elements indicate that the CU3D is partitioned based on the 3D pyramid structure. Model parameters of the tensor that are skipped during an encoding process based on the 3D pyramid structure are excluded from the dependent quantization construction process.

In an embodiment, a fourth syntax element associated with the CU3D indicating whether all model parameters of the CU3D are unified can be received. In an embodiment, a zero value as a value of a prior neighbor of a first coefficient in a kernel of the tensor can be used for determining a context model for entropy decoding the first coefficient in the kernel. In an embodiment, one or more fifth syntax elements indicating a width or a height of a second CTU3D of the tensor in the bitstream can be received. It can determined to decode model parameters of the second CTU3D based on a baseline coding method when the width, the height, or both the width and height are 1 model parameter.

In some examples, another apparatus of neural network model decompression includes processing circuitry. The processing circuitry can be configured to receive a first syntax element associated with a CTU3D partitioned from a tensor in a layer of a neural network in a bitstream of a compressed neural network representation of the neural network. The first syntax element can indicate whether all child nodes at a bottom depth of a pyramid tree structure associated with the CTU3D are unified. The CTU3D can be decoded based on a 3-dimensional-unitree (3D-unitree) coding method when the first syntax element indicates that all child nodes at the bottom depth of the pyramid tree structure associated with the CTU3D are unified.

In an embodiment, a second syntax element associated with the layer of the neural network can be received in the bitstream. The second syntax element can indicate whether the layer is encoded using a pyramid tree structure based coding method. In an embodiment, the child nodes at the bottom depth that do not share a same parent node have different unification values.

In an embodiment, a start depth of the 3D-unitree coding method can be inferred to be the bottom depth of the pyramid tree structure. In an embodiment, unification flags of nodes at the bottom depth of the pyramid tree structure are not encoded in the bitstream. In an embodiment, a unification value can be received that is encoded in the bitstream for all child nodes at the bottom depth that share a same parent node. Sign bits of all the child nodes at the bottom depth that share the same parent node can be received. The sign bits follows the unification value in the bitstream.

In an embodiment, a unification value for each group of child nodes at the bottom depth that share a same parent node can be received from the bitstream. Sign bits of the child nodes in each group of the child nodes at the bottom depth that share the same parent node can be received.

In an embodiment, responsive to the first syntax element indicates not all child nodes at the bottom depth of the pyramid tree structure associated with the CTU3D are unified, the CTU3D can be decoded based on a 3-dimensional-tagtree (3D-tagtree) coding method. In an embodiment, a start depth of the 3D-tagtree coding method can be inferred to be the bottom depth of the pyramid tree structure.

In an embodiment, values of the nodes at the bottom depth of the pyramid tree structure can be decoded according to one of: receiving the values of the nodes at the bottom depth of the pyramid tree structure each encoded in the bitstream based on a predefined scan order, receiving an absolute value followed by a sign, if the absolute value is non-zero, for each of the nodes at the bottom depth of the pyramid tree structure in the bitstream based on a predefined scan order, or receiving an absolute value for each of the nodes at the bottom depth of the pyramid tree structure in the bitstream based on a predefined scan order followed by receiving a sign for each of the nodes, if the node has a non-zero value, at the bottom depth of the pyramid tree structure in the bitstream based on a predefined scan order.

Aspects of the disclosure also provide a non-transitory computer-readable medium storing instructions which when executed by a computer for neural network model decompression cause the computer to perform the methods of neural network model decompression.

BRIEF DESCRIPTION OF THE DRAWINGS

Further features, the nature, and various advantages of the disclosed subject matter will be more apparent from the following detailed description and the accompanying drawings in which:

FIG. 4 illustrates an example NNR bitstream (400).

FIG. 5 shows an example NNR unit syntax.

FIG. 6 shows an example NNR unit header syntax.

FIG. 7 shows an example NNR aggregate unit header syntax.

FIG. 8 shows an example NNR unit payload syntax.

FIG. 9 shows an example NNR model parameter set payload syntax.

FIG. 10 shows an example syntax of a model parameter set.

FIG. 11 shows an example syntax of an aggregate unit header including signaling of coding tree unit (CTU) scan orders for one or more weight tensors.

FIG. 12 shows a syntax example of scanning weight coefficients in a weight tensor.

FIG. 13 shows an example for decoding the absolute values of quantized weight coefficients according to some embodiments of the disclosure.

FIG. 14 shows two examples of adaptive 3-dimensional CTU (CTU3D)/3-dimensional coding unit (CU3D) partition using a raster scan at a vertical direction.

DETAILED DESCRIPTION OF EMBODIMENTS

Aspects of the disclosure provide various techniques for neural network model compression/decompression. The techniques relate to coding tree unit (CTU) block partitioning, 3D pyramid structure based coding, and unification based coding.

Artificial neural networks can be adopted for a broad range of tasks in multimedia analysis and processing, media coding, data analytics, and many other fields. Success of using artificial neural networks is based on the feasibility of processing much larger and complex neural networks (deep neural networks, DNNs) than in the past, and the availability of large-scale training data sets. As a consequence, trained neural networks can contain a large number of model parameters, resulting in a quite large size (e.g., several hundred MBs). The model parameters can include coefficients of the trained neural networks such as weights, biases, scaling factors, batch-normalization (batchnorm) parameters, or the like. Those model parameters can be organized into model parameter tensors. A model parameter tensor is used to refer to a multidimensional structure (e.g., array or matrix) that groups related model parameters of a neural network together. For example, the coefficients of a layer in a neural network, when available, can be grouped into a weight tensor, a bias tensor, a scaling factor tensor, a batchnorm tensor, or the like.

Many applications require the deployment of a particular trained network instance, potentially to a larger number of devices, which may have limitations in terms of processing power and memory (e.g., mobile devices or smart cameras) and also in terms of communication bandwidth. Those applications can benefit from neural network compression/decompression techniques disclosed herein.

I. Neural Network Based Devices and Applications

Figure 1:
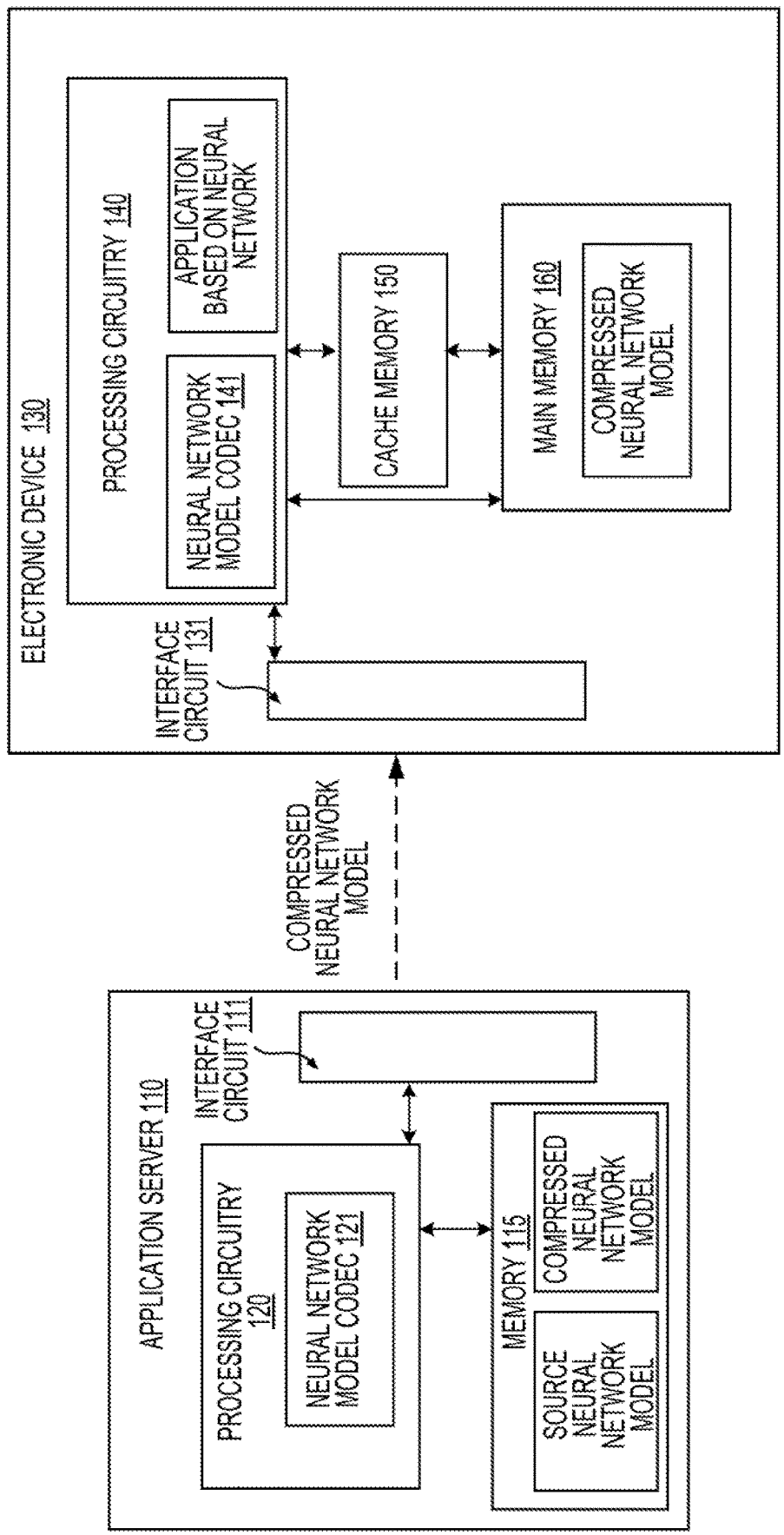
FIG. 1 shows a block diagram of an electronic device (130) according to an embodiment of the disclosure.

FIG. 1 shows a block diagram of an electronic device (130) according to an embodiment of the disclosure. The electronic device (130) can be configured to run neural network based applications. In some embodiments, the electronic device (130) receives and stores a compressed (encoded) neural network model (e.g., a compressed representation of a neural network in form of a bitstream). The electronic device (130) can decompress (or decode) the compressed neural network model to restore the neural network model, and can run an application that is based on the neural network model. In some embodiments, the compressed neural network model is provided from a server, such as an application server (110).

In the FIG. 1 example, the application server (110) includes processing circuitry (120), a memory (115), and interface circuitry (111) coupled together. In some examples, a neural network is suitably generated, trained, or updated. The neural network can be stored in the memory (115) as a source neural network model. The processing circuitry (120) includes a neural network model codec (121). The neural network model codec (121) includes an encoder that can compress the source neural network model and generate a compressed neural network model (compressed representation of the neural network). In some examples, the compressed neural network model is in the form of a bitstream. The compressed neural network model can be stored in the memory (115). The application server (110) can provide the compressed neural network model to other devices, such as the electronic device (130), via the interface circuit (111) in the form of a bitstream.

It is noted that the electronic device (130) can be any suitable device, such as a smartphone, a camera, a tablet computer, a laptop computer, a desktop computer, a gaming headset, and the like.

In the FIG. 1 example, the electronic device (130) includes processing circuitry (140), cache memory (150), main memory (160), and interface circuit (131) coupled together. In some examples, the compressed neural network model is received by the electronic device (130) via the interface circuit (131), for example in the form of a bitstream. The compressed neural network model is stored in the main memory (160).

The processing circuitry (140) includes any suitable processing hardware, such as central processing units (CPUs), graphics processing units (GPUs), and the like. The processing circuitry (140) includes suitable components to execute applications based on neural networks, and includes suitable components configured as a neural network model codec (141). The neural network model codec (141) includes a decoder that can decode, for example, the compressed neural network model received from the application server (110). In an example, the processing circuitry (140) includes a single chip (e.g., integrated circuit) with one or more processors disposed on the single chip. In another example, the processing circuitry (140) includes multiple chips, and each chip can include one or more processors.

In some embodiments, the main memory (160) has a relatively large storage space and can store various information, such as software codes, media data (e.g., video, audio, image, etc.), compressed neural network models, and the like. The cache memory (150) has relatively small storage space, but a much faster access speed compared to the main memory (160). In some examples, the main memory (160) can include hard disc drives, solid state drives, and the like, and the cache memory (150) can include static random access memory (SRAM), and the like. In an example, the cache memory (150) can be on-chip memory that is disposed on, for example, a processor chip. In another example, the cache memory (150) can be off-chip memory that is disposed on one or more memory chips that are separate from the processor chips. Generally, on-chip memory has faster access speed than off-chip memory.

In some embodiments, when the processing circuitry (140) executes an application that uses a neural network model, the neural network model codec (141) can decompress the compressed neural network model to restore the neural network model. In some examples, the cache memory (150) is large enough, thus the restored neural network model can be buffered in the cache memory (150). Then, the processing circuitry (140) can access the cache memory (150) to use the restored neural network model in the application. In another example, the cache memory (150) has limited memory space (e.g., on-chip memory), the compressed neural network model can be decompressed layer by layer, or block by block, and the cache memory (150) can buffer the restored neural network model layer by layer or block by block.

It is noted that the neural network model codec (121) and the neural network model codec (141) can be implemented by any suitable techniques. In some embodiments, encoder and/or decoder can be implemented by integrated circuits. In some embodiments, encoder and decoder can be implemented as one or more processors executing a program that is stored in a non-transitory computer-readable medium. The neural network model codec (121) and the neural network model codec (141) can be implemented according to the encoding and decoding features described below.

The present disclosure provides techniques for compressed neural network representation (NNR) that can be used to encode and decode neural network models, such as deep neural network (DNN) models, to save both storage and computation. Deep Neural Network (DNN) can be used in a large range of video applications, such as semantic classification, target detection/recognition, target tracking, video quality enhancement, and the like.

A neural network (or an artificial neural network) generally includes multiple layers between the input layer and the output layer. In some examples, a layer in the neural network corresponds to the mathematical manipulation to turn the inputs of the layer into the outputs of the layer. The mathematical manipulation can be a linear relationship or a non-linear relationship. The neural network can move through the layers to calculate the probability of each output. Each mathematical manipulation as such is considered a layer, and complex DNN can have many layers. In some examples, mathematical manipulation of a layer can be represented by one or more tensors (e.g., weight tensor, bias tensor, scaling factor tensor batchnorm tensor, or the like).

II. Block Definition and Usage for Neural Network Model Compression

1. High Level Syntax

In some embodiments, high level syntax for a bitstream carrying a neural network (model) in a compressed or coded representation can be defined based on the concept of NNR unit. An NNR unit is a data structure for carrying neural network data and related metadata. NNR units carry compressed or uncompressed information about neural network metadata, topology information, complete or partial layer data, filters, kernels, biases, quantization weights, tensors, and the like.

Figure 2:
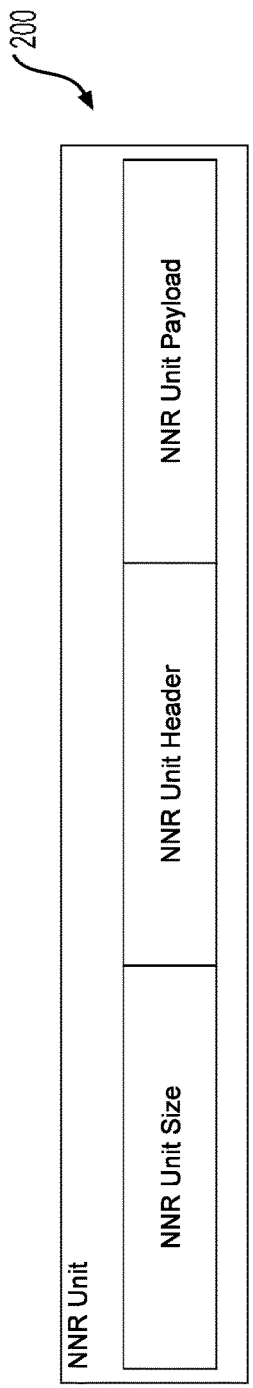
FIG. 2 illustrates an example compressed neural network representation (NNR) unit (200).

FIG. 2 illustrates an example NNR unit (200). As shown, the NNR unit (200) can include the following data elements:
NNR unit size: This data element signals the total byte size of the NNR Unit including the NNR unit size itself.
NNR unit header: This data element contains information about the NNR unit type and related metadata.
NNR unit payload: This data element contains compressed or uncompressed data related to the neural network.

Figure 3:
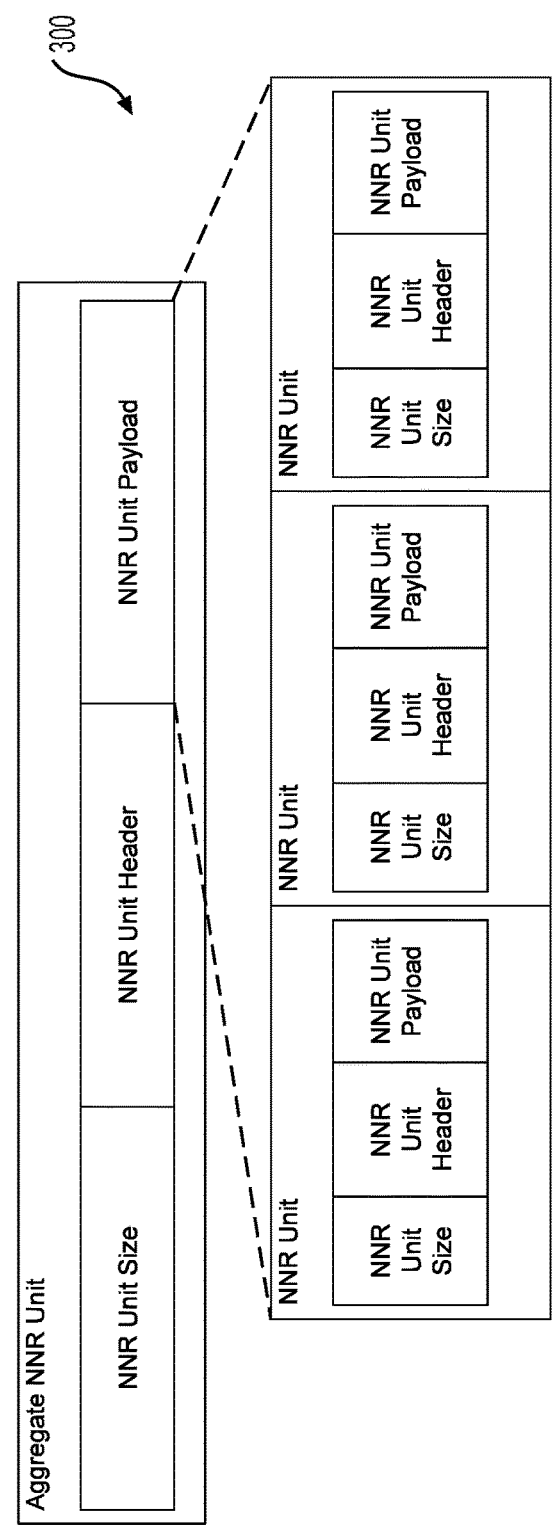
FIG. 3 illustrates an example aggregate NNR unit (300).

FIG. 3 illustrates an example aggregate NNR unit (300). The aggregate NNR unit (300) is an NNR unit that can carry multiple NNR units in its payload. Aggregate NNR units provide a grouping mechanism for several NNR units that are related to each other and benefit from aggregation under a single NNR unit. FIG. 4 illustrates an example NNR bitstream (400). The NNR bitstream (400) can include a sequence of NNR Units. The first NNR unit in an NNR bitstream can be an NNR start unit (i.e. NNR unit of type NNR_STR).

FIG. 5 shows an example NNR unit syntax. FIG. 6 shows an example NNR unit header syntax. FIG. 7 shows an example NNR aggregate unit header syntax. FIG. 8 shows an example NNR unit payload syntax. FIG. 9 shows an example NNR model parameter set payload syntax.

2. Reshaping and Scan Order

In some examples, the dimensions of a weight tensor are more than two (such as four in a convolution layer) and the weight tensor can be reshaped to a two-dimension (2D) tensor. No reshape is performed if the dimensions of a weight tensor are no more than two (such as a fully connected layer or bias layer) in an example. To encode the weight tensor, weight coefficients in the weight tensor are scanned according to a certain order. In some examples, the weight coefficients in the weight tensor can be scanned in a row-first manner from the left to the right for each row and from the top row to the bottom row, for example.

3. Block Partitioning Flag

In some embodiments, a weight tensor can be reshaped to a 2D tensor that is subsequently partitioned into blocks referred to as coding tree units (CTUs). Then, coefficients of the 2D tensor can be encoded based on the resulting CTU blocks. For example, a scan order can be defined based on those CTU blocks, and the encoding can be performed according to the scan order. In some other embodiments, a weight tensor can be reshaped to a 3D tensor, for example, having the numbers of the input channels and output channels as the first and second dimensions, respectively, and the number of elements in a kernel (filter) as the third dimension. Then, block partition can be performed along the plane of the first and second dimensions resulting in 3D blocks referred to as CTU3Ds. Encoding of the tensor can accordingly be performed based on a scan order of those CTU3Ds. In some examples, the CTU bocks or CTU3D blocks can be equal-sized blocks.

In some embodiments, a model-wise syntax element, ctu_partition_flag, is used to specify if block partitioning (CTU partitioning) is enabled for weight tensors of each layer of a neural network. For example, a first value of the syntax element (e.g., value 0) indicates that the block partitioning is disabled, and a second value of the syntax element (e.g., value 1) indicates that the block partitioning is enabled. In one embodiment, the syntax element is a 1-bit flag. In another embodiment, the syntax element may be represented by multiple bits. One value of the syntax element indicates whether the block partitioning is performed or not. For example, a value of zero can indicate no partition is performed. Other values of the syntax element can be used to indicate a size of the CTU or CTU3D blocks.

FIG. 10 shows an example syntax of a model parameter set. The model parameter set includes a ctu_partition_flag. The ctu_parition_flag can be used to turn on or turn off the block partitioning for a neural network model controlled by the model parameter set.

In some embodiments, a tensor-wise syntax element, ctu_partition_flag, can be used to specify if the block partitioning (CTU partitioning) is enabled for one or more individual weight tensors of a neural network. For example, a first value of the syntax element (e.g., value 0) indicates that the block partitioning is disabled for the respective one or more tensors, and a second value of the syntax element (e.g., value 1) indicates that the block partitioning is enabled for the respective one or more tensors. In one embodiment, the syntax element is a 1-bit flag. In another embodiment, the syntax element may be represented by multiple bits. One value of the syntax element indicates whether the block partitioning is performed or not for the respective one or more tensors. For example, a value of zero can indicate no partition is performed for the respective one or more tensors. Other values of the syntax element can be used to indicate a size of the CTU or CTU3D blocks partitioned from the respective one or more tensors.

In an example, the tensor-wise syntax element ctu_partition_flag is included in a compressed data unit header. In an example, the tensor-wise syntax element ctu_partition_flag is included in an aggregate unit header.

4. Signaling of CTU Dimensions

In one embodiment, when a model-wise flag ctu_partition_flag has a value indicating block partitioning is enabled, a model-wise 2 bits max_ctu_dim_flag can be used to specify a model-wise max CTU dimension (denoted gctu_dim) for weight tensors of a neural network. For example, gctu can be determined according to:

gctu_dim=(64>>max_ctu_dim_flag).

For example, corresponding to max_ctu_dim_flag having values of 0, 1, 2, or 3, the gctu_dim can have a value of 64, 32, 16, and 8.

In an embodiment, for 2D reshaped tensors, the tensor-wise max CTU width can be scaled by the kernel size of each convolution tensor as follows:

max_ctu_height=gctu_dim, max_ctu_width=gctu_dim*kernel_size.

The height/width of right/bottom CTUs may be less than the max_ctu_height/max_ctu_width. It is noted that the number of bits for max_ctu_dim_flag can be changed to other values (e.g., more than 2 bits). The gctu_dim can be calculated using other mapping functions with respect to max_ctu_dim_flag. The max_ctu_width may not be scaled by kernel_size (for example, for partitioning of CTU3D blocks). Or, the max_ctu_width can be scaled by any arbitrary values to form suitable 2D or 3D blocks with various sizes.

In another embodiment, when a model-wise or tensor-wise flag ctu_partition_flag has a value indicating block partitioning is enabled, a tensor-wise 2 bits max_ctu_dim_flag can be used to specify a tensor-wise max CTU dimension for a respective weight tensor of a neural network according to:

gctu_dim=(64>>max_ctu_dim_flag).

In an embodiment, the tensor-wise max CTU width can be scaled by the kernel size of each convolution tensor as follows:

max_ctu_height=gctu_dim, max_ctu_width=gctu_dim*kernel_size.

Similarly, the height/width of right/bottom CTUs may be less than the max_ctu_height/max_ctu_width. The number of bits for the tensor-wise max_ctu_dim_flag can be changed to other values (e.g., more than 2 bits). The gctu_dim can be calculated using other mapping function with respect to the tensor-wise max_ctu_dim_flag. The max_ctu_width may not be scaled by kernel_size (for example, for partitioning of CTU3D blocks). The max_ctu_width can be scaled by any arbitrary values to form suitable 2D or 3D blocks with various sizes.

5. CTU Scan Order

In some embodiments, a tensor-wise syntax element ctu_scan_order is used to specify a CTU-wise (or CTU3D) scan order for respective one or more tensors. For example, a first value of the tensor-wise syntax element ctu_scan_order (e.g., value 0) indicates that the CTU-wise scan order is a raster scan order at a horizontal direction. A second value of the tensor-wise syntax element ctu_scan_order (e.g., value 1) indicates that the CTU-wise scan order is a raster scan order at a vertical direction. In an example, the tensor-wise syntax element ctu_scan_order is included in a compressed data unit header. In an example, the tensor-wise syntax element ctu_scan_order is included in an aggregate unit header.

In an embodiment, the tensor-wise syntax element ctu_scan_order is included in a syntax table when a model-wise syntax element flag ctu_partition_flag has a value indicating block (CTU) partitioning is enabled.

FIG. 11 shows an example syntax of an aggregate unit header including signaling of CTU scan orders for one or more weight tensors. At row (1101), a FOR loop is executed for multiple NNR units. Each of the multiple NNR units can include a weight tensor for example. For each of the multiple NNR units, when a ctu_partition_flag has a value indicating CTU partitioning is enabled (row (1102)), a ctu_scan_order [i] can be received where i can be an index of each of the multiple NNR units. The ctu_partition_flag can be a model-wise syntax element.

In addition, at row (1102), a syntax element quant bit-depth [i] can be received for each of the one or more NNR units. The quant_bitdepth[i] can specify the maximum bit depth of quantized coefficients for each tensor in the NNR aggregate unit.

In another embodiment, the tensor-wise syntax element ctu_scan_order is included in a syntax table when a tensor-wise syntax element flag ctu_partition_flag has a value indicating block (CTU) partitioning is enabled for the respective one or more tensors.

6. Flag Dependency

In an example, a ctupartition flag is defined as a model-wise flag. A ctu_scan_order flag is placed at an nnr_aggregate_unit_header section (e.g., in the FIG. 11 example). The ctu_partition_flag is placed at an nnr_model_parameter_set_payload section within an nnr_aggregate_unit. The nnr_aggregate_unit_header can be serialized before the nnr_model_parameter_set_payload, which makes it impossible to decode the ctu_scan_order.

To solve the problem, in an example, a model-wise nnr_unit can be arranged in serial before any nnr_aggregate_units. The ctu_partition_flag and the max_ctu_dim_flag can be included in this nnr_unit. Accordingly, the NNR aggregate units following the nnr_unit can use any information defined in the nnr_unit.

III. 3D Pyramid Coding for Neural Network Model Compression

1. Scan Order

FIG. 12 shows a syntax example of scanning weight coefficients in a weight tensor. For example, the dimensions of a weight tensor are more than two (such as four in a convolution layer) and the weight tensor can be reshaped to a two-dimension tensor. No reshape is performed if the dimensions of a weight tensor are no more than two (such as a fully connected layer or bias layer) in an example. To encode the weight tensor, weight coefficients in the weight tensor are scanned according to a certain order. In some examples, the weight coefficients in the weight tensor can be scanned in a row-first manner from the left to the right for each row and from the top row to the bottom row, for example.

In the FIG. 12 example, the 2D integer array StateTransTab[ ][ ] specifies the state transition table for dependent scalar quantization and can be configured as follows:

StateTransTab[ ][ ]={{0, 2},{7, 5},{1, 3},{6, 4},{2, 0},{5, 7},{3, 1},{4, 6}}.

2. Quantization

In various embodiments, three types of quantization methods can be used: a baseline quantization method, a codebook-based quantization method, and a dependent scalar quantization method.

In the baseline quantization method, uniform quantization can be applied to the model parameter tensors (or parameter tensors) using a fixed step size. In an example, the fixed step size can be represented by parameters qpDensity and qp. A flag, denoted as dq_flag, can be used to enable the uniform quantization (e.g., dq_flag is equal to zero). The reconstructed values in the decoded tensor can be integer multiples of the step size.

In the codebook-based method, the model parameter tensors can be represented as a codebook and tensors of indices, the latter having the same shape as the original tensors. The size of the codebook can be chosen at the encoder and transmitted as a metadata parameter. The indices have integer values, and can be further entropy coded. In an example, the codebook is composed of float 32-bits values. The reconstructed values in the decoded tensors are the values of codebook elements referred to by their index values.

In the dependent scalar quantization method, dependent scalar quantization can be applied to the parameter tensors using a fixed step size represented by parameters of qpDensity and qp, for example, and a state transition table of size 8. A flag, denoted as dq_flag, equal to one can be used to enable the dependent scalar quantization. The reconstructed values in the decoded tensor are integer multiples of the step size.

3. Entropy Coding

To encode the quantized weight coefficients, entropy coding techniques can be used. In some embodiments, an absolute value of the quantized weight coefficient is coded in a sequence that includes a unary sequence that may be followed by a fixed length sequence.

In some examples, the distribution of the weight coefficients in a layer generally follows Gaussian distribution, and the percentage of weight coefficients with a large value is very small, but the maximum value of the weight coefficients can be very large. In some embodiments, very smaller values can be coded using unary coding, and the larger values can be coded based on Golomb coding. For example, an integer parameter that is referred to as maxNumNoRem is used to indicate the maximum number when Golomb coding is not used. When a quantized weight coefficient is not greater than (e.g., is equal or smaller than) maxNumNoRem, the quantized weight coefficient can be coded by the unary coding. When the quantized weight coefficient is greater than maxNumNoRem, a portion of the quantized weigh coefficient equal to maxNumNoRem is coded by unary coding, and the remainder of the quantized weight coefficient is coded by Golomb coding. Thus, the unary sequence includes a first portion of the unary coding and a second portion of bits for coding the exponential Golomb remainder bits.

In some embodiments, a quantized weight coefficient can be coded by the following two steps.

In a first step, a binary syntax element sig_flag is encoded for the quantized weight coefficient. The binary syntax element sig_flag specifies whether the quantized weight coefficient is equal to zero. If the sig_flag is equal to one (indicates that the quantized weight coefficient is not equal to zero), a binary syntax element sign_flag is further encoded. The binary syntax element sign_flag indicates whether the quantized weight coefficient is positive or negative.

In the second step, the absolute value of the quantized weight coefficient can be coded into a sequence that includes a unary sequence that may be followed by a fixed length sequence. When the absolute value of the quantized weight coefficient is equal to or smaller than maxNumNoRem, the sequence includes unary coding of the absolute value of the quantized weight coefficient. When the absolute value of the quantized weight coefficient is greater than maxNumNoRem, the unary sequence can include a first part for coding maxNumNoRem using unary coding, and a second part for coding the exponential Golomb remainder bits, and the fixed length sequence is for coding a fixed length remainder.

In some examples, a unary coding is applied first. For example, a variable, such as j, is initialized with 0, and another variable X is set to j+1. A syntax element abs_level_greater_X is encoded. In an example, when the absolute value of the quantized weight level is greater than the variable X, abs_level_greater_X is set to 1, the unary encoding continues; otherwise, abs_level_greater_X is set to 0, and unary encoding is done. When abs_level_greater_X is equal to 1, and the variable j is smaller than maxNumNoRem, the variable j is increased by 1 and the variable X is also increased by 1. Then, a further syntax element abs_level_greater_X is encoded. The process continues until abs_level_greater_X is equal to 0 or the variable j is equal to maxNumNoRem. When the variable j is equal to maxNumNoRem, the encoded bits are the first part of the unary sequence.

When abs_level_greater_X is equal to 1 and j is equal to maxNumNoRem, the coding continues with Golomb coding. Specifically, the variable j is reset to 0, and X is set to 1<<j. A unary coding remainder can be calculated as the absolute value of the quantized weight coefficient subtracting maxNumNoRem. A syntax element abs_level_greater_than X is encoded. In an example, when the unary coding remainder is greater than the variable X, abs_level_greater_X is set to 1; otherwise, abs_level_greater_X is set to 0. If the abs_level_greater_X is equal to 1, the variable j is increased by 1, and 1<<j is added to X and a further abs_level_greater_X is encoded. The procedure is continued until an abs_level_greater_X is equal to 0, thus the second part of the unary sequence is encoded. When an abs_level_greater_X is equal to 0, the unary coding remainder can be one of the values (X, X −1, ... X−(1<<j)+1). A code of length j can be used to code an index that points to one value in (X, X−1, ... X−(1<<j)+1), the code can be referred to as a fixed length remainder.

FIG. 13 shows an example for decoding the absolute values of quantized weight coefficients according to some embodiments of the disclosure. In the FIG. 13 example, QuantWeight[i] denotes the quantized weight coefficient at the ith position in an array; sig_flag specifies whether the quantized weight coefficient QuantWeight[i] is nonzero (e.g., sig_flag being 0 indicates that QuantWeight[i] is zero); sign_flag specifies whether the quantized weight coefficient QuantWeight[i] is positive or negative (e.g., sign_flag being 1 indicates that QuantWeight[i] is negative); abs_level_greater_x[j] indicates whether the absolute level of QuantWeight[i] is greater j+1 (e.g., first part of the unary sequence); abs_level_greater_x2[j] comprises the unary part of the exponential Golomb remainder (e.g., second part of the unary sequence); and abs_remainder indicates a fixed length remainder.

According to an aspect of the disclosure, a context modeling approach can be used in the coding of the three flags sig_flag, sign_flag, and abs_level_greater_X. Thus, flags with similar statistical behavior can be associated with the same context model, so that the probability estimator (inside of the context model) can adapt to the underlying statistics.

In an example, the context modeling approach uses three context models for the sig_flag, depending on whether the neighboring quantized weight coefficient to the left is zero, smaller, or larger than zero.

In another example, the context model approach uses three other context models for the sign_flag, depending on whether the neighboring quantized weight coefficient to the left is zero, smaller, or larger than zero.

In another example, for each of the abs_level_greater_X flags, the context modeling approach uses either one or two separate context models. In an example, when X<=maxNumNoRem, two context models are used depending on the sign_flag. When X>maxNumNoRem, only one context model is used in an example.

4. CTU3D and Recursive CU3D Block Partitioning

In some embodiments, a model parameter tensor can be partitioned into CTU3D blocks that are each further partitioned into 3D coding unit (CU3D) blocks. The CU3D can further be partitioned and coded based on a pyramid structure. For example, the pyramid structure can be a 3D-Octree, a 3D-Unitree, a 3D-Tagtree or a 3D-Unitagtree structure. Weight coefficients can have a local structure after a specific train/retrain operation. Coding methods utilizing 3D-Octree, 3D-Unitree, 3D-Tagtree and/or 3D-Unitagtree structure can generate more efficient representation by making use of the local distribution of CTU3D/CU3D blocks. These pyramid structure based methods can be harmonized with a baseline method (i.e., a non-pyramid -structure-based coding method).

Typically, the dimension of a weight tensor (or a model parameter tensor) can be 4 for a convolution layer with a layout of [R][S][C][K]; 2 for a fully-connected layer with a layout of [C][K]; and 1 for a bias and batch normal layer. R and S represent a convolution kernel size (width and height), C represents input a feature size, and K represents an output feature size.

In an embodiment, for a convolution layer, the 2D [R][S] dimensions can be reshaped to a 1D [RS] dimension so that the 4D tensor [R][S][C][K] is reshaped to 3D tensor [RS][C][K]. A fully-connected layer is treated as a special case of a 3D tensor with R=S=1.

In an embodiment, a 3D tensor [RS][C][K] can be partitioned along the [C][K] plane with non-overlapping smaller blocks (CTU3D). Each CTU3D has a shape of [RS][ctu3d_height][ctu3d_width] where, in an example, ctu3d_height=max_ctu_3d_height and ctu3d_width=max_ctu3d_width. For a CTU3D locates at the right and/or bottom of the tensor, its ctu3d_height is the remainder of C/max_ctu3d_height and its ctu3d_width is the remainder of K/max_ctu3d_width.

In an embodiment, the values of max_ctu3d_height and max_ctu3d_width can be signaled in a bitstream explicitly, or can be inferred inexplicitly. The block partitioning is disabled when max_ctu3d_height=C and max_ctu3d_width=K in an example.

In an embodiment, a simplified blocking structure where CTU3D/CU3D is partitioned to smaller CU3D recursively can be performed using a quad-tree structure until a maximum recursive depth is reached. Starting from a CTU3D node, this quad-tree of CU3D blocks can be scanned and processed using a depth-first quad-tree scan order. Child nodes under same parent node are scanned and processed using raster scan order at either horizontal direction or vertical direction.

FIG. 14 shows two examples of adaptive CTU3D/CU3D partition using a raster scan at a vertical direction.

In one embodiment, for a CU3D at a given quad-tree depth, the max_cu3d_height/max_cu3d_width of these CU3Ds is calculated using below formulas.

max_cu3d_height=max_ctu3d_height>>depth
max_cu3d_width=max_ctu3d_width>>depth

A maximum recursive depth is reached when both max_cu3d_height and max_cu3d_width is smaller than or equals to a predefined threshold. This threshold can either be included in a bitstream explicitly or can be a predefined number (such as 8) that can be inferred by a decoder implicitly. This recursive partitioning is disabled when the predefined threshold is the size of CTU3D.

In an embodiment, a rate-distortion (RD) based encoding algorithm to decide whether to split a parent CU3D to multiple smaller child CU3Ds. The parent CU3D is split to multiple smaller child CU3Ds if the combined RD of these smaller child CU3Ds are smaller than the RD from parent CU3D. Otherwise, this parent CU3D is not further split. A split flag is defined to record the respective splitting decision. This flag can be skipped at the last depth of CU partitioning.

In one embodiment, the recursive CU3D block partitioning operation is performed based on a quadtree structure to partition a CTU3D into CU3D blocks, and a split flag is defined to record each splitting decision at nodes in the quadtree structure.

In another embodiment, the recursive CU3D block partitioning operation is not performed in a CTU3D block, and no split flag is defined to record the splitting decision. In this case, the CU3D block is identical to CTU3D block.

5. 3D Pyramid Structure

In various embodiments, a pyramid structure (or a 3D pyramid structure) can be a tree data structure in which each internal node can have eight children. A 3D pyramid structure can be used to partition a 3D tensor by recursively subdividing the 3D tensor (or sub-blocks such as CTU3D or CU3D) along z, y, and x axes into eight octants.

Figure 15:
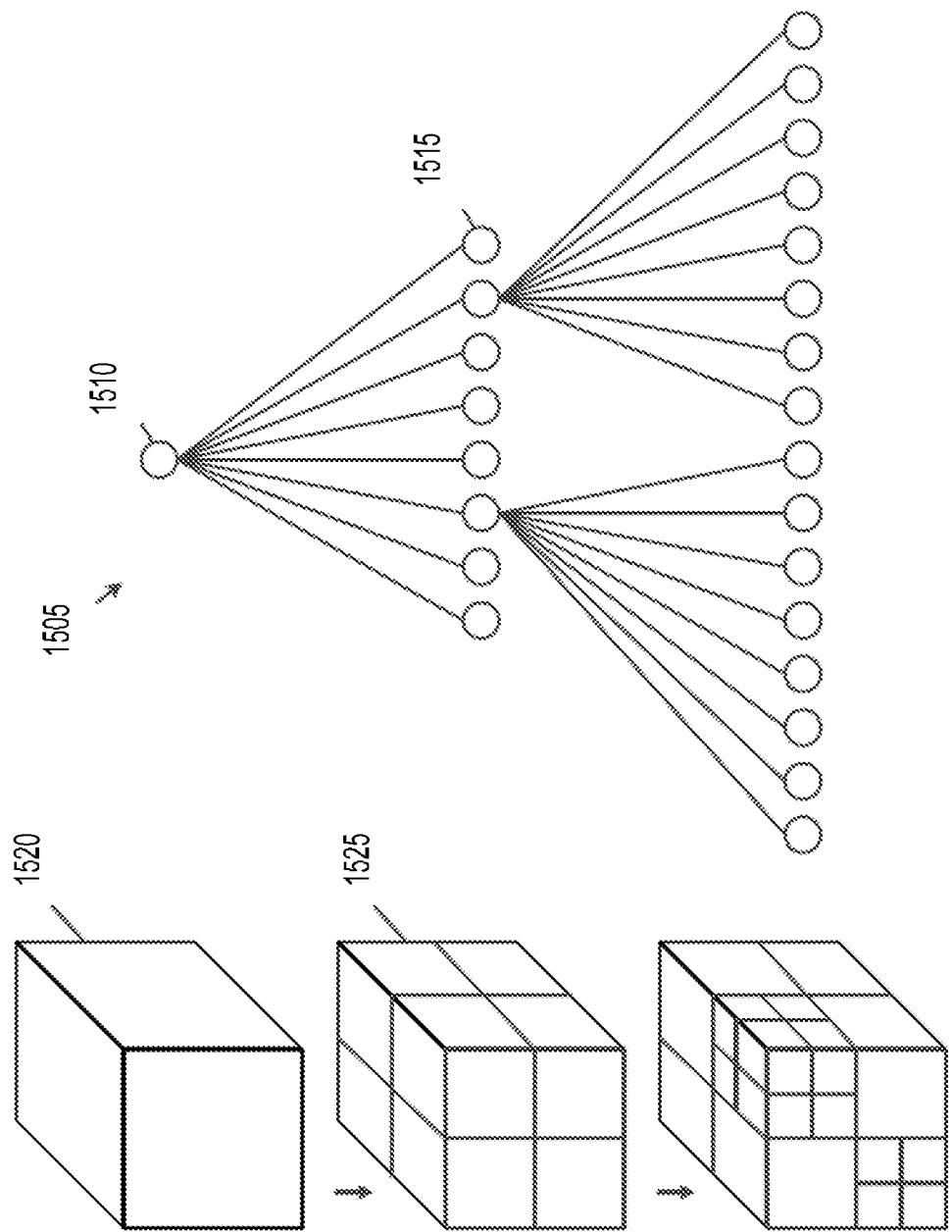
FIG. 15 shows an example partition process based on the 3D pyramid structure.

FIG. 15 shows an example partition process based on the 3D pyramid structure. As shown in FIG. 15, a 3D-Octree (1505) is a tree data structure in which each internal node (1510) has exactly eight child nodes (1515). The 3D-Octree (1505) is used to partition a three-dimensional tensor (1520) by recursively subdividing it along z, y, and x axes into eight octants (1525). A node at the last depth of the 3D-Octree (1505) can be a block having a size of 2×2×2 coefficients.

In various embodiments, different methods can be employed to construct a 3D-pyramid structure to represent coefficients in a CU3D at an encoder side or a decoder side.

In an embodiment, a 3D-Octree for a CU3D can be constructed as follows. Node value 1 for a 3D-Octree location at a last depth indicates that the codebook indexes (if codebook coding method is used) or coefficients (if direct quantization coding method is used) in corresponding node are non-zero. Node value 0 for a 3D-Octree location at a bottom depth indicates that the codebook indexes or coefficients in corresponding node are zero. The node value for a 3D-Octree location at other depths is defined as the maximum value of its eight child nodes.

In an embodiment, a 3D-Unitree for a CU3D can be constructed as follows. Node value one for a 3D-Unitree location at depth other than a last depth indicates that its child nodes (and their child nodes, including nodes at last depth) have non-unified (different) values; Node value zero for a 3D-Unitree location at depth other than last depth indicates that all its child nodes (and their child nodes, including nodes at last depth) have unified (identical) absolute values.

In an embodiment, a 3D-Tagtree for a CU3D can be constructed as follows. The node value for a 3D-Tagtree location at a last depth indicates the absolute value of codebook index (if codebook coding method is used) or absolute coefficient (if direct quantization coding method is used) in corresponding CU3D is non-zero. The node value for a 3D-Tagtree location at other depths is defined as the minimum value of its eight child nodes. In another embodiment, the node value for a 3D-Tagtree location at other depths can be defined as the maximum value of its eight child nodes.

In an embodiment, a 3D-Unitagtree for a CU3D is constructed by combining 3D-Tagtree and 3D-Unitree.

It is noted that for some CU3D blocks with different depth/height/width, there can be coefficients not enough to construct a complete 3D-Pyramid where all parent node has all eight child nodes available. The scanning and encoding of these non-exist child nodes can be skipped if a parent node doesn't have all eight child nodes.

6. 3D Pyramid Scan Order

After the 3D-Pyramid is constructed, all nodes can be walked through using a predefined scan order to encode the node values at an encoder side or decoding the node values at a decoder side.

In one embodiment, starting from a top node, a depth-first-search scan order can be employed to walk through all nodes. The scan order for child nodes that share the same parent node can be defined arbitrarily, such as (0,0,0)->(0,0,1)->(0,1,0)->(0,1,1)->(1,0,0)->(1,0,1)->(1,1,0)->(1,1,1).

In another embodiment, starting from a top node, a breadth-first-search can be employed to walk through all nodes. Because each pyramid depth is a 3D shape, the scan order in each depth can be defined arbitrarily. In an embodiment, the scan order is defined using below pseudo code to align with the pyramid coding method:

for (int d=start_depth; d<total_depth;++d)
for (int by=0; by<height[d]; by+=2)
for (int bx=0; bx<width[d]; bx+=2)
for (int bz=0; bz<length[d]; bz+=2)
for (int y=by; y <by +min(2, height[d]−by); ++y)
for (int x=bx; x <bx +min(2, width[d]−bx); ++x)
for (int z=bz; z <bz +min(2, length[d]−bz); ++z)
process node[d][z][y][x] . . .

In another embodiment, an encoding_start_depth syntax element can be employed to indicate the first depth that participates in an encoding or decoding process. When walking through all nodes using a predefined scan order, the encoding of the current node value is skipped if the depth of this node is above encoding_start_depth. Multiple CU3Ds, CTU3Ds, layers or model can share one encoding_start_depth. This syntax element can be signaled in a bitstream explicitly, or predefined and inferred inexplicitly.

In one embodiment, the encoding_start_depth is signaled in a bitstream explicitly. In another embodiment, the encoding_start_depth is predefined and inferred inexplicitly. In another embodiment, the encoding_start_depth is set to the last depth of 3D-Pyramid structure and inferred inexplicitly.

7. 3D Pyramid Coding Method

At a decoder side, after a 3D pyramid structure is constructed, corresponding coding methods can be performed to walk through all nodes and encode the coefficients represented by different 3D-trees. At a decoder side, corresponding to different coding methods, the encoded coefficients can be decoded accordingly.

For 3D-Octree, if the value of the parent node is 0, the scanning and encoding of its child nodes (and their child nodes) is skipped as their value should always be 0. If the value of a parent node is 1 and the values of all but the last child nodes are all 0s, the last child node can be scanned, but the encoding of its value is skipped as it should always be 1. If the current depth is the last depth of the pyramid and if the current node value is 1, the sign of map value is encoded when codebook method is not used, followed by the map value (quantized value) itself.

For 3D-Unitree, in one embodiment, the value of a given node can be encoded. If the node value is zero, the corresponding unified value can be encoded, and the encoding of its child nodes (and their child nodes) can be skipped as their absolute value should always equal the unified value. The child nodes can be scanned until the bottom depth is reached, where the sign bit of each child nodes can be encoded if the node value is non-zero.

For 3D-Unitree, in another embodiment, the value of a given node can be encoded. If the node value is zero, its corresponding unified value can be encoded and the scanning and encoding of its child nodes (and their child nodes) can be skipped as their absolute value should always equal the unified value. And after all nodes in this CU3D are processed, the pyramid structure can be scanned again and the sign bit of each child nodes at bottom depth can be encoded if the node value is non-zero.

For 3D-Tagtree, the value can be encoded if the node is a top node that does not have a parent node. For any child node, the difference between parent node and this child node can be encoded. If the value of a parent node is X and the values of all but the last child nodes are bigger than X, scan the last child node can be canned, but the encoding of its value is skipped as it should always be X.

For 3D_Unitagtree, the value of a given node from Unitree can be encoded first. Tagtree coding method can then be used to encode either the Tagtree value if the node is a top node that doesn't have parent node or the difference of Tagtree value between parent node and this child node. Node skipping methods introduced in Tagtree coding section are adopted as well. If the Unitree node value is zero, the scanning and encoding of its child nodes (and their child nodes) can be skipped as their value should always equal to the unified value.

In one embodiment, when an encoding_start_depth is a last depth, these coefficients skipping methods described herein can be disabled so all coefficients are encoded. In an example, a syntax element can be received in a bitstream at a decoder side that indicates a start depth in a 3D pyramid structure. When the start depth is the last depth of the 3D pyramid structure, model parameters of a model parameter tensor can be decoded from the bitstream using a non-3D-pyramid-tree-based decoding method.

In another embodiment, when an encoding_start_depth is a last depth, to take advantage of these coefficients skipping methods described herein, the 3D pyramid tree can be encoded by adjusting a start depth so that the start depth is the second last depth. In an example, a syntax element indicating a start depth in a 3D pyramid structure can be received in a bitstream at a decoder. When the start depth is the last depth of the 3D pyramid structure, a decoding process can start from the second last depth of the depths of the 3D pyramid structure at the decoder.

In another embodiment, when an encoding_start_depth is a last depth, for 3D-Unitagtree, the unitree part of a 3D pyramid tree can be encoded by adjusting the encoding_start_depth so that encoding_start_depth is the second last depth. The tagtree part of 3D pyramid tree can be encoded without adjusting the encoding_start_depth. In an example, a syntax element indicating a start depth in a 3D pyramid structure can be received in a bitstream at a decoder. When the start depth is the last depth of the 3D pyramid structure and the 3D pyramid structure is a unitagtree structure associated with unitree part encoding and tagtree part encoding, a decoding process can be performed at the decoder as follows. For the unitree part encoding, the receiving the decoding process can start from the second last depth of the depths of the 3D pyramid structure. For the tagtree part encoding, the decoding process can start from the last depth of the depths of the 3D pyramid structure.

8. Dependent Quantization

In some embodiments, a dependent scalar quantization method is used for neural network parameter approximation. A related entropy coding method can be used to cooperate with the quantization method. The method introduces dependencies between the quantized parameter values, which reduces the distortion in parameter approximation. Additionally, the dependencies can be exploited in the entropy coding stage.

In dependent quantization, the admissible reconstruction values for a neural network parameter (e.g., weight parameter) depend on the selected quantization indexes for the preceding neural network parameters in reconstruction order. The main effect of the approach is that, in comparison to conventional scalar quantization, the admissible reconstruction vectors (given by all reconstructed neural network parameters of a layer) are packed denser in the N-dimensional vector space (N represents the number of parameters in a layer). That means, for a given average number of admissible reconstruction vectors per N-dimensional unit volume, the average distance (e.g. Mean Squared Error (MSE) or Mean Absolute Error (MAE) distortion) between an input vector and the closest reconstruction vector is reduced (for typical distributions of input vectors).

In the dependent quantization process, parameters can be reconstructed in a scanning order (in the same order in which they are entropy decoded), due to the dependencies between the reconstructed values. Then, the method of dependent scalar quantization can be realized by defining two scalar quantizers with different reconstruction levels and defining a process for switching between the two scalar quantizers. Accordingly, for each parameter, there can be two available scalar quantizers as shown in FIG. 16.

Figure 16:
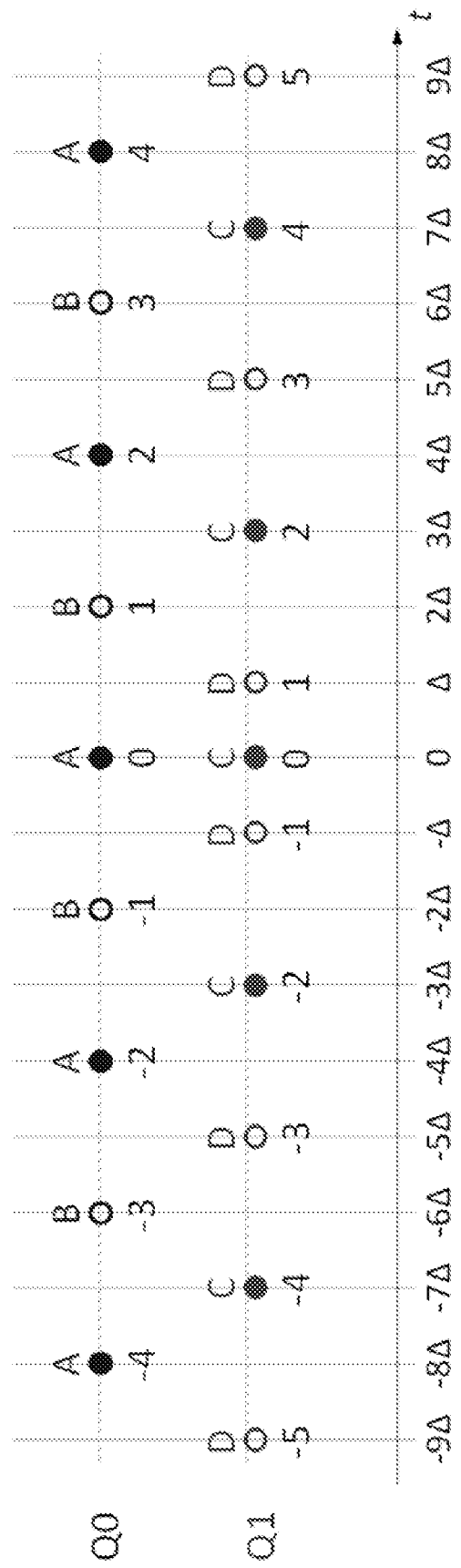
FIG. 16 shows two scalar quantizers according to embodiments of the disclosure.

FIG. 16 shows the two scalar quantizers used according to embodiments of the disclosure. The first quantizer Q0 maps the neural network parameter levels (numbers from −4 to 4 below the points) to even integer multiples of the quantization step size $\Delta$. The second quantizer Q1 maps the neural network parameter levels (numbers from −5 to 5) to odd integer multiples of the quantization step size $\Delta$ or to zero.

For both the quantizers Q0 and Q1, the location of the available reconstruction levels is uniquely specified by the quantization step size $\Delta$. The two scalar quantizers Q0 and Q1 are characterized as follows:

Q0: The reconstruction levels of the first quantizer Q0 are given by the even integer multiples of the quantization step size $\Delta$. When this quantizer is used, a reconstructed neural network parameter t' is calculated according to $$t' = 2 \cdot k \cdot \Delta,$$

where k denotes the associated parameter level (transmitted quantization index).

Q1: The reconstruction levels of the second quantizer Q1 are given by the odd integer multiples of the quantization step size $\Delta$ and the reconstruction level equal to zero. The mapping of neural network parameter levels k to reconstructed parameters t' is specified by $$t' = (2 \cdot k - \mathrm{sgn}(k)) \cdot \Delta,$$

where sgn (·) denotes the signum function $$\mathrm{sgn}(x) = \begin{cases} 1 & : x > 0 \\ 0 & : x = 0 \\ -1 & : x < 0 \end{cases}.$$

Instead of signaling the used quantizer (Q0 or Q1) for a current weight parameter explicitly in the bitstream, it is determined by the parities of the weight parameter levels that precede the current weight parameter in coding/reconstruction order. The switching between the quantizers is realized via a state machine, which is represented by Table 1. The state has eight possible values (0, 1, 2, 3, 4, 5, 6, 7) and is uniquely determined by the parities of the weight parameter levels preceding the current weight parameter in coding/reconstruction order. For each layer, the state variable is initially set to 0. When a weight parameter is reconstructed, the state is updated afterwards according to Table 1 where k denotes the value of the transform coefficient level. The next state depends on the current state and the parity (k & 1) of the current weight parameter level k. Hence, the state update can be obtained by:

state=sttab[state][k& 1]

where sttab represents Table 1.

Table 1 shows a state transition table for determining the scalar quantizer used for the neural network parameters, where k denotes the value of the neural network parameter:

TABLE 1

| current state | next state for | | Quantizer (Q0/Q1) for current parameter |
|---|---|---|---|
| | (k & 1) == 0 | (k & 1) == 1 | |
| 0 | 0 | 2 | 0 |
| 1 | 7 | 5 | 1 |
| 2 | 1 | 3 | 0 |
| 3 | 6 | 4 | 1 |
| 4 | 2 | 0 | 0 |
| 5 | 5 | 7 | 1 |
| 6 | 3 | 1 | 0 |
| 7 | 4 | 6 | 1 |

The state uniquely specifies the scalar quantizer used. If the state value for a current weight parameter is even (0, 2, 4, 6), the scalar quantizer Q0 is used. Otherwise, if the state value is odd (1, 3, 5, 7), scalar quantizer Q1 is used.

In some embodiments, a baseline coding method (where no 3D pyramid structure based encoding/decoding method is used) can be employed. In the baseline coding method, all coefficients of a model parameter tensor can be scanned and entropy coded according to a scanning order. For a dependent quantization process used in combination with the baseline coding method, the coefficients can be reconstructed in the scanning order (in the same order in which they are entropy decoded), Due to the nature of the 3D pyramid coding methods described herein, certain coefficients in a model parameter tensor can be skipped from entropy coding process. Accordingly, in one embodiment, a dependent quantization process (which operates on all the coefficients in the model parameter tensor) can be disabled when a 3D pyramid coding method is used.

In another embodiment, dependent quantization process can be enabled when a 3D pyramid coding method is used. For example, a dependent quantization construction process can be modified so that these coefficients, if they are skipped from entropy coding process, can be excluded from the construction of dependent quantization coefficients. In an example, a dependent quantization construction process can be performed over a CU3D when one or more syntax elements indicate that the CU3D is partitioned based on a 3D pyramid structure. Model parameters of the CU3D that are skipped during an encoding process based on the 3D pyramid structure are excluded from the dependent quantization construction process.

In another embodiment, absolute values of coefficients are used in the dependent quantization.

9. Context for Entropy Coding

In some embodiments, when dependent quantization is not used, the context modeling can be performed as follows.

For an octree node value, denoted Oct_flag, and a sign, denoted sign, in the 3D-Octree based coding method, the context model indexes, denoted ctx, can be determined according to:

Oct_flag:

$\quad$ int $p0=(z>=1)?oct[d][z-1][y][y]:0;$ $\quad$ int $p1=(z>=2)?oct[d][z-2][y][x]:0;$ $\quad$ int $ctx=(p0==p1)?!!p0:2;$ sign:

$\quad$ int $p0=(z>=1)?map[z-1][y][x]:0;$ $\quad$ int $ctx=(p0==0)?0:(p0<0)?1:2.$ In above calculations, oct[d][z][y][x] represents a node value at the position of [z][y][x] at the depth of d; and map[z][y][x] represent a quantized value at the position of [z][y][x].

For a non-zero flag, denoted nz_flag, and a sign, denoted sign, in the 3D-Unitree based coding method, the context model indexes, denoted ctx, can be determined according to:

nz_flag:

$\quad$ int $p0=(last\_depth\&\&map\_z>=1)?std::abs(map[map\_z-1][map\_y][map\_x]):0;$ $\quad$ int $ctx=(p0==0)?0:1$ sign:

$\quad$ int $p0=(z>=1)?map[z-1][y][x]:0;$ $\quad$ int $ctx=(p0==0)?0:(p0<0)?1:2.$ For 3D-Tagtree based coding method, the context model indexes, denoted ctx, of a non-zero flag, denoted nz flag, and a sign, denoted sign can be determined according to:

nz_flag:

$\quad$ int $p0=(z>=1)?tgt[d][z-1][y][x]:0;$ $\quad$ int $p1=(z>=2)?tgt[d][z-2][y][x]:0;$ $\quad$ int $ctx=(p0==p1)?!!p0:2;$ sign:

$\quad$ int $p0=(z>=1)?tgt[d][z-1][y][x]:0;$ $\quad$ int $ctx=(p0==0)?0:(p0<0)?1:2,$ where tgt[d][z][y][x] represents a node value at the position of [z][y][x] at the depth of d.

For 3D_Unitagtree, the context model indexes, denoted ctx, of a non-zero flag, denoted nz_flag, and a sign, denoted sign can be determined according to:

nz_flag:

$\quad$ int $p0=(z>=1)?tgt[d][z-1][y][x]:0;$ $\quad$ int $p1=(z>=2)?tgt[d][z-2][y][x]:0;$ $\quad$ int $ctx=(p0==p1)?!!p0:2;$ sign:

$\quad$ int $p0=(z>=1)?map[z-1][y][x]:0;$ $\quad$ int $ctx=(p0==0)?0:(p0<0)?1:2.$ In an example, when dependent quantization is used, the context modeling for nz_flag can be adjusted so that ctx=ctx+3*state_id.

10. Syntax Clean Up

It is possible that all coefficients in a CU3D are unified. In an embodiment, a uaflag can be defined in a CU3D header to indicate whether all coefficients in a CU3D are unified. In an example, a value of uaflag=1 indicates that all coefficients in this CU3D are unified.

In an embodiment, a ctu3d_map _mode_flag can be defined to indicate if all CU3D blocks in a CTU3D share the same map_mode. The map_mode is signaled if ctu3d_map_mode_flag=1. It is noted that this flag can also be inferred (as 0) inexplicitly.

In an embodiment, an enable_start_depth can be defined to indicate if cu3d encoding can start from depth other than bottom depth. The start_depth (or encoding_start_depth) is signaled if enable_start_depth=1. It is noted that this flag can also be inferred (as 1) inexplicitly.

In an embodiment, an enable_zdep_reorder flag can be defined to indicate that if reorder of zdep_array is allowed. It is noted that this flag can also be inferred (as 0) inexplicitly.

11. Harmonization of Baseline and Pyramid Coding Methods

In the baseline method, a weight tensor can be reshaped to a 2D matrix with a shape of [output_channel][input_channel*kernel size]. Coefficients in a same kernel are store in consecutive memory locations. When calculating a context of sig_flag and sign_flag, the neighboring coefficient is defined as the last coefficient that is processed prior to a current coefficient. For example, the neighbor coefficient of the first coefficient in one kernel is the last coefficient in a previous kernel.

In an embodiment, for calculating context model indexes, for the first coefficient in one kernel, the value of its neighbor coefficient is set to 0 instead of the value of last coefficient in a previous kernel.

In an embodiment, during a 3D pyramid coding process, if the quantization mode is not codebook mode and if the start_depth is the last pyramid depth, the baseline coding method is selected and its RD is calculated and compared with other mode (e.g., 3D pyramid structure based coding methods).

In an embodiment, if the ctu3d_width and/or ctu3d_height is 1, the baseline coding method is automatically selected.

12. Syntax Tables of 3D Pyramid Coding

In Appendix B of this disclosure, syntax tables Table 2-Table 17 are listed as an example of the 3D pyramid structure based coding approach disclosed herein. The syntax elements introduced in the listed syntax tables are defined at the end of each respective syntax table.

13. Unification Based Coding Method for Neural Network Model Compression

In some embodiments, a unification based coding method can be employed. A layer_uniform_flag flag can be defined for a convolution and fully-connect layer to indicate that if this layer is encoded using a 3D pyramid structure based coding method. In an example, if the layer_uniform_flag flag equals a first value (e.g., zero), this layer is encoded using the baseline method.

If the layer_uniform_flag equals a second value (e.g., one), the 3D pyramid structure based coding method can be used. For example, the layer can be reshaped to CTU3D layout. For each CTU3D, a ctu3d_uniform_flag flag can be defined to indicate that if all child nodes at the bottom depth that share the same parent node are unified (nodes that don't share the same parent node may have different unification value).

If the ctu3d_uniform_flag flag equals a first value (e.g., one), for this CTU3D, all child nodes at bottom depth that share the same parent node are unified (nodes that don't share the same parent node may have different unification value), in one embodiment, a 3D-Unitree coding method can be to encode this CTU3D. An encoding_start_depth is set to the last depth of 3D-Pyramid structure (e.g., associated with a CU3D or the CTU3D) and inferred inexplicitly. Encoding of the unification value of the node can be skipped as they should always be 0.

In one embodiment, one unification value can be encoded for all child nodes at bottom depth that share the same parent node, followed by the sign bits of these child nodes if the node value is non-zero. In another embodiment, one unification value can be encoded for all child nodes at bottom depth that share the same parent node. And after all nodes in this CU3D are processed, the pyramid (the pyramid structure) can be scanned again to encode the sign bit of each child nodes at bottom depth if the node value is non-zero.

If the ctu3d_uniform_flag flag equals a second value (e.g., zero), in one embodiment, a 3D-Tagtree coding method can be used to encode this CTU3D. An encoding_start_depth is set to the last depth of a 3D-Pyramid structure (e.g., associated with a CU3D or the CTU3D) and inferred inexplicitly.

In one embodiment, the value of each child node can be encoded based on the predefined scan order. In another embodiment, the absolute value of each child node can be encoded, followed by encoding its sign bit, based on the predefined scan order. In another embodiment, the absolute values can be encoded for all child nodes based on the predefined scan order. And after all nodes in this CU3D are processed, the sign bits of all child nodes can be encoded if the node value is non-zero.

14. Syntax Tables of Unification Based Coding

In Appendix C of this disclosure, syntax tables Table 18-Table 21 are listed as an example of the unification based coding method disclosed herein. The syntax elements introduced in the listed syntax tables are defined at the end of each respective syntax table.

IV. Examples of Coding Processes

Figure 17:
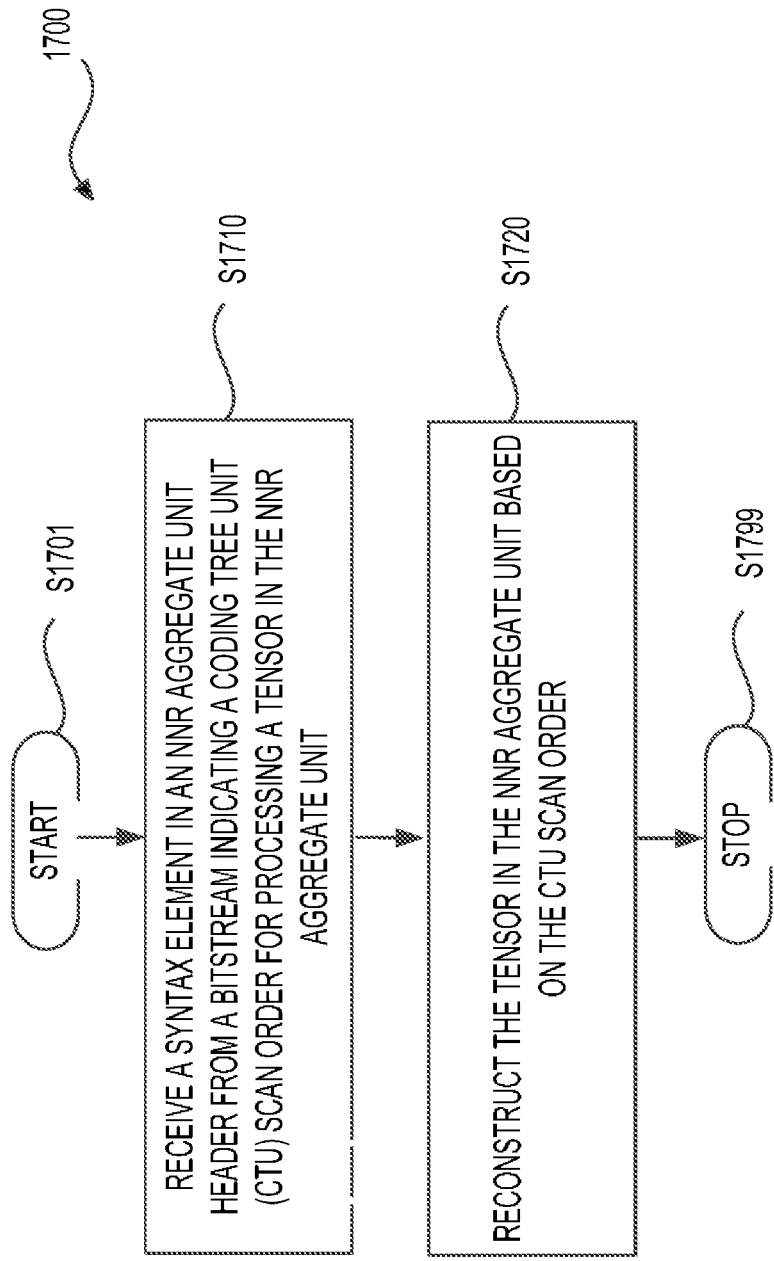
FIG. 17 shows a decoding process (1700) of CTU partition according to an embodiment of the disclosure.

FIG. 17 shows a decoding process (1700) of CTU partition according to an embodiment of the disclosure. The process (1700) can start from (S1701) and proceed to (S1710).

At (S1710), a first syntax element can be received in an NNR aggregate unit header of an NNR aggregate unit from a bitstream. The first syntax element can indicate a CTU scan order for processing a model parameter tensor transmitted in the NNR aggregate unit. For example, a first value of the first syntax element can indicate that the CTU scan order is a first raster scan order at a horizontal direction. A second value of the first syntax element can indicate that the CTU scan order is a second raster scan order at a vertical direction.

In an example, a further syntax element can be received in advance to control whether a CTU block partitioning is enabled for the tensor in the NNR aggregate unit. For example, the further syntax element can be a model-wise syntax element to specify whether the CTU block partitioning is enabled for layers of the neural network, or a tensor-wise syntax element to specify whether the CTU block partitioning is enabled for the tensor in the NNR aggregate unit.

At (S1720), the tensor in the NNR aggregate unit can be reconstructed based on the CTU scan order. When the CTU block partitioning is enabled for the tensor in the NNR aggregate unit, at an encoder side, the tensor can be partitioned into CTUs. The CTUs can be scanned and encoded according to the scan order indicated by the first syntax element. At a decoder side, based on the indicated scan order, the decoder can understand the order the CTUs are encoded and accordingly organize the decoded CTUs into the tensor. The process (1700) can proceed to (S1799) and terminate at (S1799).

Figure 18:
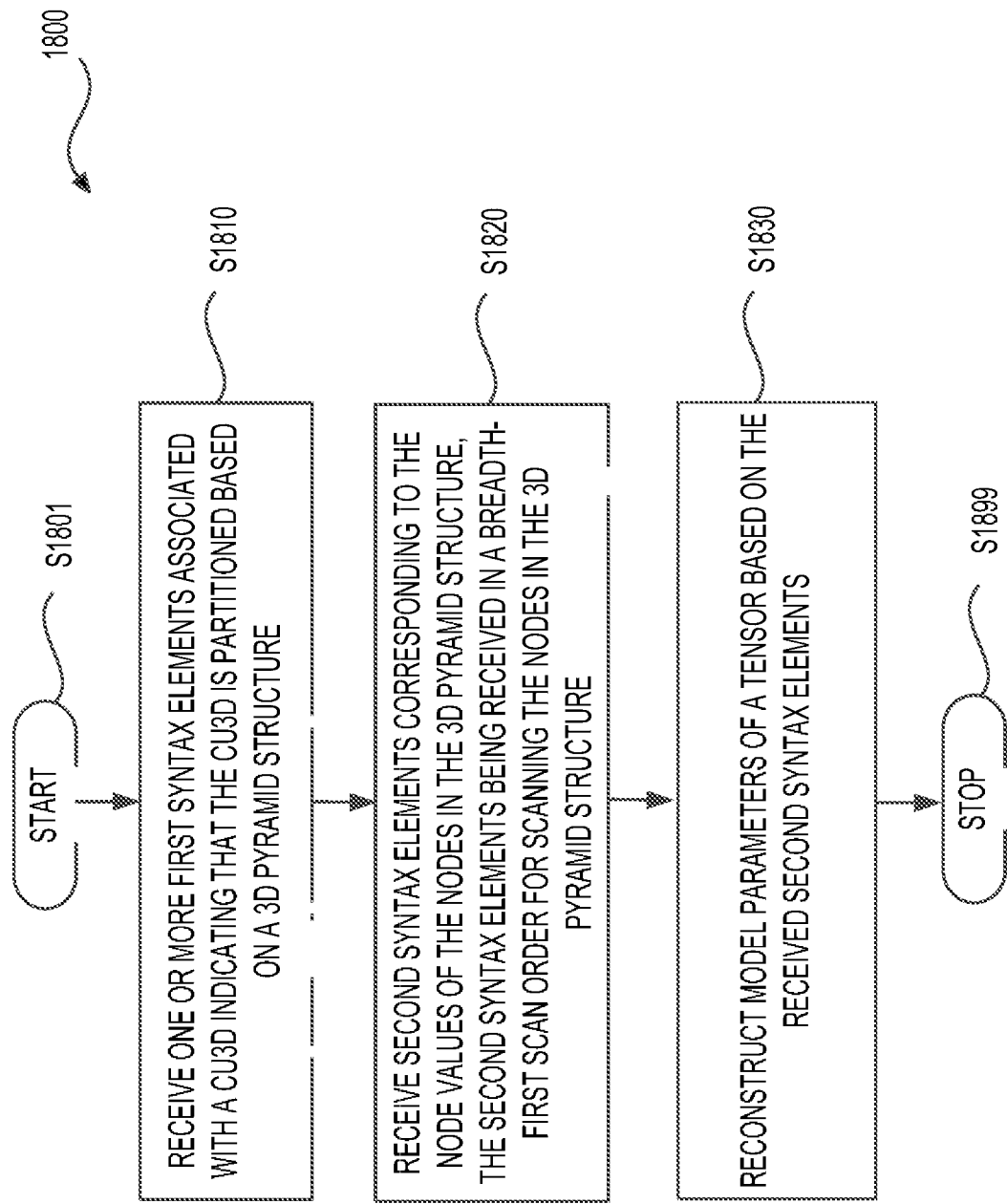
FIG. 18 shows a decoding process (1800) of 3D pyramid coding according to an embodiment of the disclosure.

FIG. 18 shows a decoding process (1800) of 3D pyramid coding according to an embodiment of the disclosure. The process (1800) can start from (S1801) and proceed to (S1810).

At (S1810), one or more first syntax elements can be received from a bitstream of a compressed neural network representation. The one or more first syntax elements can be associated with a CU3D partitioned from a CTU3D. The CTU3D can be partitioned from a tensor in a neural network. The one or more first syntax elements can indicate that the CU3D is partitioned based on a coding mode corresponding to a 3D pyramid structure. The 3D pyramid structure can include multiple depths. Each depth corresponds to one or more nodes. Each node has a node value. For example, the 3D pyramid structure can be one of an octree structure, a unitree structure, a tagtree structure, a unitagtree structure, or the like.

At (S1820), a sequence of second syntax elements corresponding to the node values of the nodes in the 3D pyramid structure can be received from the bitstream in a breadth-first scan order for scanning the nodes in the 3D pyramid structure. Accordingly, at a decoder side, node values (represented by syntax elements) can be received based on the depth-first scan order. In other embodiments (not implementing the process (1800)), a 3D pyramid structure may be scanned according to a depth-first scan order at an encoder side.

At (S1830), model parameters of the tensor can be reconstructed based on the received second syntax elements corresponding to the node values of the nodes in the 3D pyramid structure. As described above, at a decoder, corresponding to the octree structure, unitree structure, tagtree structure, or unitagtree structure, a 3D pyramid coding method can be employed to encode the node values of the 3D pyramid structure and the coefficient values of the CU3D partitioned using the 3D pyramid structure. At a decoder, corresponding to the employed 3D pyramid coding method, the node values and coefficient values can accordingly be reconstructed. The process can proceed to (S1899) and terminate at (S1899).

Figure 19:
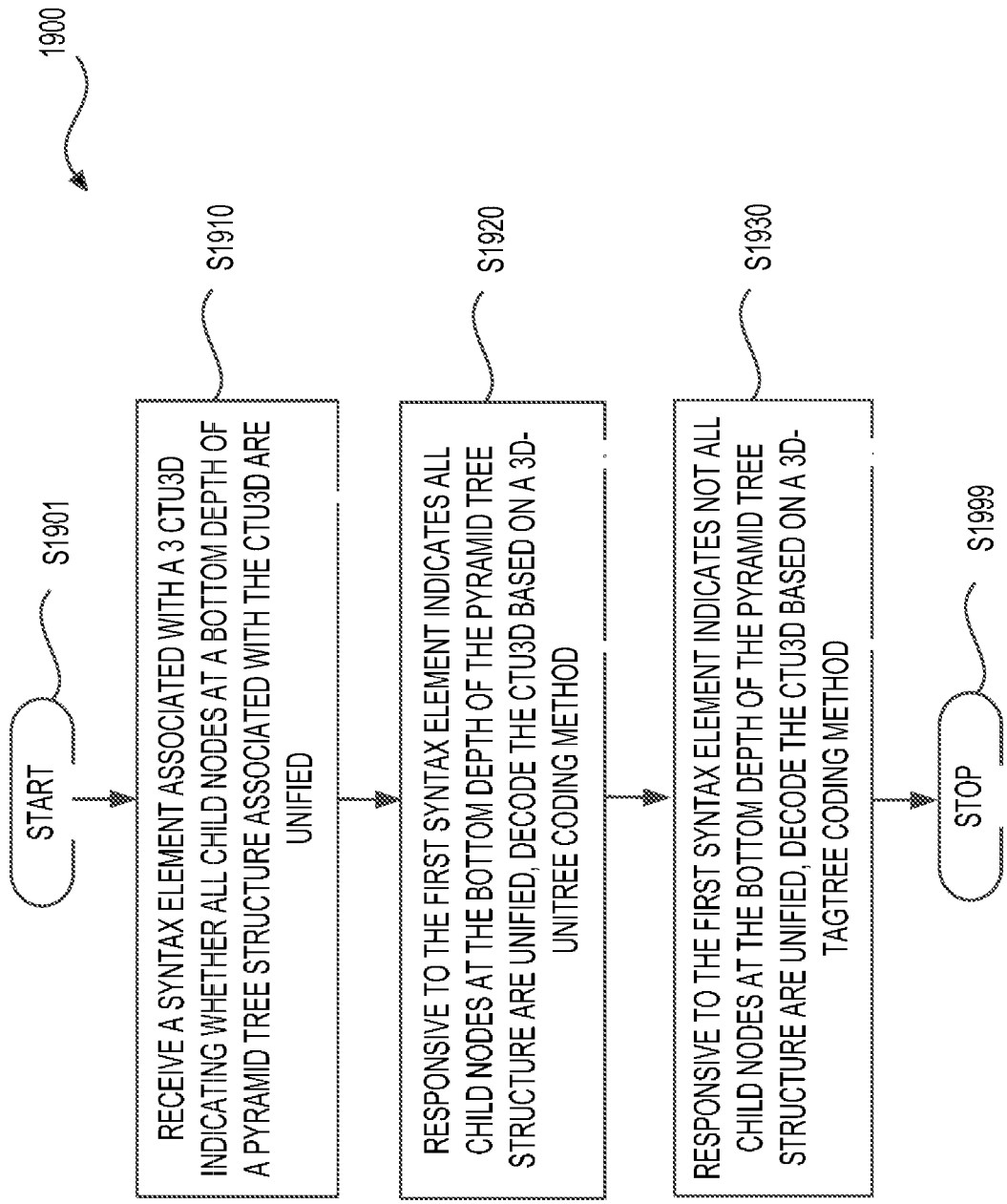
FIG. 19 shows a decoding process (1900) of unification based coding according to an embodiment of the disclosure.

FIG. 19 shows a decoding process (1900) of unification based coding according to an embodiment of the disclosure. The process (1900) can start from (S1901) and proceed to (S1910).

At (S1910), a syntax element associated with a CTU3D can be received. The CTU3D can be partitioned from a tensor in a layer of a neural network in a bitstream of a compressed neural network representation of the neural network. The syntax element can indicate whether all child nodes at a bottom depth of a pyramid tree structure associated with the CTU3D are unified. The child nodes at the bottom depth that do not share a same parent node may have different unification values.

At (S1920), responsive to the syntax element indicates all child nodes at the bottom depth of the pyramid tree structure associated with the CTU3D are unified, the CTU3D can be decoded based on a 3D-unitree coding method. In an example, a start depth of the 3D-unitree coding method can be inferred to be the bottom depth of the pyramid tree structure. In an embodiment, unification flags of nodes at the bottom depth of the pyramid tree structure are not encoded in the bitstream.

In an embodiment, a unification value that is encoded in the bitstream for all child nodes at the bottom depth that share a same parent node can be received. Sign bits of all the child nodes at the bottom depth that share the same parent node can be received. The sign bits follow the unification value in the bitstream.

In an embodiment, a unification value for each group of child nodes at the bottom depth that share a same parent node can be received. Sign bits of the child nodes in each group of the child nodes at the bottom depth that share the same parent node can then be received.

At (S1930), responsive to the syntax element indicates not all child nodes at the bottom depth of the pyramid tree structure associated with the CTU3D are unified, the CTU3D can be decoded based on a 3D-tagtree coding method. In an example, a start depth of the 3D-tagtree coding method can be inferred to be the bottom depth of the pyramid tree structure.

In various embodiments, values of the nodes at the bottom depth of the pyramid tree structure can be decoded according to one of the following methods. In a first method, the values of the nodes at the bottom depth of the pyramid tree structure each encoded in the bitstream based on a predefined scan order can be received.

In a second method, an absolute value can be received followed by a sign (if the absolute value is non-zero) for each of the nodes at the bottom depth of the pyramid tree structure in the bitstream based on a predefined scan order. In a third method, an absolute value can be received for each of the nodes at the bottom depth of the pyramid tree structure in the bitstream based on a predefined scan order followed by receiving a sign for each of the nodes (if the node has a non-zero value) at the bottom depth of the pyramid tree structure in the bitstream based on a predefined scan order. The process (1900) can proceed to (S1999) and terminate at (S1999).

V. Computer System

The techniques described above, can be implemented as computer software using computer-readable instructions and physically stored in one or more computer-readable media. For example, FIG. 20 shows a computer system (2000) suitable for implementing certain embodiments of the disclosed subject matter.

The computer software can be coded using any suitable machine code or computer language, that may be subject to assembly, compilation, linking, or like mechanisms to create code comprising instructions that can be executed directly, or through interpretation, micro-code execution, and the like, by one or more computer central processing units (CPUs), Graphics Processing Units (GPUs), and the like.

The instructions can be executed on various types of computers or components thereof, including, for example, personal computers, tablet computers, servers, smartphones, gaming devices, internet of things devices, and the like.

Figure 20:
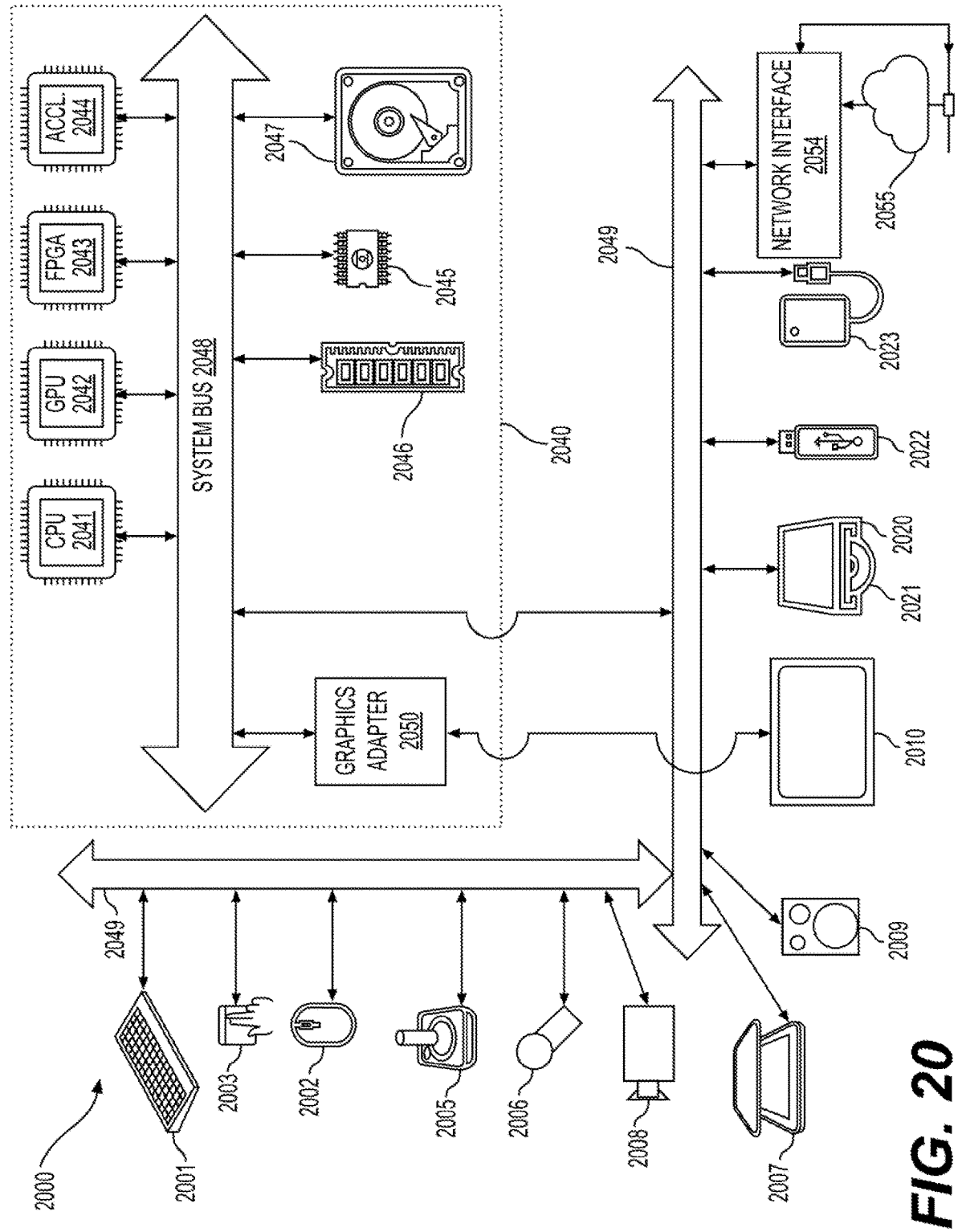
FIG. 20 is a schematic illustration of a computer system in accordance with an embodiment of the disclosure.

The components shown in FIG. 20 for a computer system (2000) are exemplary in nature and are not intended to suggest any limitation as to the scope of use or functionality of the computer software implementing embodiments of the present disclosure. Neither should the configuration of components be interpreted as having any dependency or requirement relating to any one or combination of components illustrated in the exemplary embodiment of a computer system (2000).

Computer system (2000) may include certain human interface input devices. Such a human interface input device may be responsive to input by one or more human users through, for example, tactile input (such as keystrokes, swipes, data glove movements), audio input (such as voice, clapping), visual input (such as gestures), olfactory input (not depicted). The human interface devices can also be used to capture certain media not necessarily directly related to conscious input by a human, such as audio (such as speech, music, ambient sound), images (such as scanned images, photographic images obtained from a still image camera), video (such as 2D video, 3D video including stereoscopic video).

Input human interface devices may include one or more of (only one of each depicted): keyboard (2001), mouse (2002), trackpad (2003), touch screen (2010), data-glove (not shown), joystick (2005), microphone (2006), scanner (2007), camera (2008).

Computer system (2000) may also include certain human interface output devices. Such human interface output devices may be stimulating the senses of one or more human users through, for example, tactile output, sound, light, and smell/taste. Such human interface output devices may include tactile output devices (for example tactile feedback by the touch-screen (2010), data-glove (not shown), or joystick (2005), but there can also be tactile feedback devices that do not serve as input devices), audio output devices (such as speakers (2009), headphones (not depicted)), visual output devices (such as screens (2010) to include CRT screens, LCD screens, plasma screens, OLED screens, each with or without touch-screen input capability, each with or without tactile feedback capability—some of which may be capable to 2D visual output or more than 3D output through means such as stereographic output; virtual-reality glasses (not depicted), holographic displays and smoke tanks (not depicted)), and printers (not depicted).

Computer system (2000) can also include human accessible storage devices and their associated media such as optical media including CD/DVD ROM/RW (2020) with CD/DVD or the like media (2021), thumb-drive (2022), removable hard drive or solid state drive (2023), legacy magnetic media such as tape and floppy disc (not depicted), specialized ROM/ASIC/PLD based devices such as security dongles (not depicted), and the like.

Those skilled in the art should also understand that term "computer readable media" as used in connection with the presently disclosed subject matter does not encompass transmission media, carrier waves, or other transitory signals.

Computer system (2000) can also include an interface to one or more communication networks. Networks can for example be wireless, wireline, optical. Networks can further be local, wide-area, metropolitan, vehicular and industrial, real-time, delay-tolerant, and so on. Examples of networks include local area networks such as Ethernet, wireless LANs, cellular networks to include GSM, 3G, 4G, 5G, LTE and the like, TV wireline or wireless wide area digital networks to include cable TV, satellite TV, and terrestrial broadcast TV, vehicular and industrial to include CANBus, and so forth. Certain networks commonly require external network interface adapters that attached to certain general purpose data ports or peripheral buses (2049) (such as, for example USB ports of the computer system (2000)); others are commonly integrated into the core of the computer system (2000) by attachment to a system bus as described below (for example Ethernet interface into a PC computer system or cellular network interface into a smartphone computer system). Using any of these networks, computer system (2000) can communicate with other entities. Such communication can be uni-directional, receive only (for example, broadcast TV), uni-directional send-only (for example CANbus to certain CANbus devices), or bi-directional, for example to other computer systems using local or wide area digital networks. Certain protocols and protocol stacks can be used on each of those networks and network interfaces as described above.

Aforementioned human interface devices, human-accessible storage devices, and network interfaces can be attached to a core (2040) of the computer system (2000).

The core (2040) can include one or more Central Processing Units (CPU) (2041), Graphics Processing Units (GPU) (2042), specialized programmable processing units in the form of Field Programmable Gate Areas (FPGA) (2043), hardware accelerators for certain tasks (2044), and so forth. These devices, along with Read-only memory (ROM) (2045), Random-access memory (2046), internal mass storage such as internal non-user accessible hard drives, SSDs, and the like (2047), may be connected through a system bus (2048). In some computer systems, the system bus (2048) can be accessible in the form of one or more physical plugs to enable extensions by additional CPUs, GPU, and the like. The peripheral devices can be attached either directly to the core's system bus (2048), or through a peripheral bus (2049). Architectures for a peripheral bus include PCI, USB, and the like.

CPUs (2041), GPUs (2042), FPGAs (2043), and accelerators (2044) can execute certain instructions that, in combination, can make up the aforementioned computer code. That computer code can be stored in ROM (2045) or RAM (2046). Transitional data can be also be stored in RAM (2046), whereas permanent data can be stored for example, in the internal mass storage (2047). Fast storage and retrieval to any of the memory devices can be enabled through the use of cache memory that can be closely associated with one or more CPU (2041), GPU (2042), mass storage (2047), ROM (2045), RAM (2046), and the like.

The computer readable media can have computer code thereon for performing various computer-implemented operations. The media and computer code can be those specially designed and constructed for the purposes of the present disclosure, or they can be of the kind well known and available to those having skill in the computer software arts.

As an example and not by way of limitation, the computer system having architecture (2000), and specifically the core (2040) can provide functionality as a result of processor(s) (including CPUs, GPUs, FPGA, accelerators, and the like) executing software embodied in one or more tangible, computer-readable media. Such computer-readable media can be media associated with user-accessible mass storage as introduced above, as well as certain storage of the core (2040) that are of non-transitory nature, such as core-internal mass storage (2047) or ROM (2045). The software implementing various embodiments of the present disclosure can be stored in such devices and executed by core (2040). A computer-readable medium can include one or more memory devices or chips, according to particular needs. The software can cause the core (2040) and specifically the processors therein (including CPU, GPU, FPGA, and the like) to execute particular processes or particular parts of particular processes described herein, including defining data structures stored in RAM (2046) and modifying such data structures according to the processes defined by the software. In addition or as an alternative, the computer system can provide functionality as a result of logic hardwired or otherwise embodied in a circuit (for example, accelerator (2044)), which can operate in place of or together with software to execute particular processes or particular parts of particular processes described herein. Reference to software can encompass logic, and vice versa, where appropriate. Reference to a computer-readable media can encompass a circuit (such as an integrated circuit (IC)) storing software for execution, a circuit embodying logic for execution, or both, where appropriate. The present disclosure encompasses any suitable combination of hardware and software.

While this disclosure has described several exemplary embodiments, there are alterations, permutations, and various substitute equivalents, which fall within the scope of the disclosure. It will thus be appreciated that those skilled in the art will be able to devise numerous systems and methods which, although not explicitly shown or described herein, embody the principles of the disclosure and are thus within the spirit and scope thereof.

Appendix A: Acronyms
DNN: Deep Neural Network
NNR: Compressed Neural Network Representation; Coded Representation of Neural Network
CTU: Coding Tree Unit
CTU3D: 3-Dimension Coding Tree Unit
CU: Coding Unit
CU3D: 3-Dimension Coding Unit
RD: Rate-Distortion
Appendix B: Syntax Tables of Pyramid Coding Approach

TABLE 2

```
nnr( ) {
  ......
  nnr_header( )
  for(layer_idx=0;layer_idx<total_layer;++layer_idx){
    layer_header( )
    sublayer_idx=0
    do{
      if(enable_max_ctu3d_size){
        if(layer_dim[sublayer_idx]==4&&layer_shape[sublayer_idx][2]==1){
          max_ctu3d_width=1
          max_ctu3d_height=1<<(bitdepth(int(max_ctu3d_size*max_ctu3d_size/
                  layer_shape[sublayer_idx][0]/layer_shape[sublayer_idx][1])-1))
        }else if(layer_dim[sublayer_idx]==4&&layer_shape[sublayer_idx][3]==1){
          max_ctu3d_width=1<<(bitdepth(int(max_ctu3d_size*max_ctu3d_size/
                  layer_shape[sublayer_idx][0]/layer_shape[sublayer_idx][1])-1))
          max_ctu3d_height=1
        }else{
```

TABLE 2-continued

```
            max_ctu3d_width=1<<(bitdepth(int(max_ctu3d_size*max_ctu3d_size/
                    layer_shape[sublayer_idx][0]/layer_shape[sublayer_idx][1])-1))
            max_ctu3d_height=1<<(bitdepth(int(max_ctu3d_size*max_ctu3d_size/
                    layer_shape[sublayer_idx][0]/layer_shape[sublayer_idx][1])-1))
        }else{
            max_ctu3d_height=max_ctu3d_size
            max_ctu3d_width=max_ctu3d_size
        }
        if(layer_dim[sublayer_idx]==1){
            array1d( )
            end_of_layer( )
        }else{
Include_bias=layer_dim[sublayer_idx]!=1&&sublayer_idx+1<total_sublayer&&layer_dim[subl
ayer_idx+1]==1
            if(include_bias){
                array1d( )
                end_of_layer( )
            }
            if(include_scaling)
                array1d( )
            if(layer_scan_order==SCAN_CK){
                for(c=0;c<layer_shape[sublayer_idx][2];c+=max_ctu3d_height){
                    for(k=0;k<layer_shape[sublayer_idx][3];k+=max_ctu3d_width){
                        ctu3d_height=min(max_ctu3d_height, layer_shape[sublayer_idx][3]-c);
                        ctu3d_width=min(max_ctu3d_width, layer_shape[sublayer_idx][2]-k);
                        ctu3d(c,k,ctu3d_height,ctu3d_width)
                        end_of_layer( )
                    }
                }
            }else if(layer_scan_order==SCAN_KC){
                for(k=0;k<layer_shape[sublayer_idx][3];k+=max_ctu3d_width){
                    for(c=0;c<layer_shape[sublayer_idx][2];c+=max_ctu3d_height){
                        ctu3d_height=min(max_ctu3d_height, layer_shape[sublayer_idx][3]-c);
                        ctu3d_width=min(max_ctu3d_width, layer_shape[sublayer_idx][2]-k);
                        ctu3d(c,k,ctu3d_height,ctu3d_width)
                        end_of_layer( )
                    }
                }
            }
        }
        sublayer_idx += 1 + include_bias + include_scaling
    }while(sublayer_idx < total_sublayer)
}
......
}
```

TABLE 3

```
nnr_header( ) {
    ......
    total_layer
    enable_escape_reorder
    enable_max_ctu3d_size
    max_ctu3d_idx
    ......
}
``` total_layer number of total layer (can be removed if model structure is available)

enable_escape_reorder 0 indicates that escape reorder is not allowed, 1 indicates that escape reorder is allowed enable_max_ctu3d_size 0 indicates that ctu3d_height/ctu3d_width is kept unchanged regardless of the kernel size, 1 indicates that ctu3d_height/ctu3d_width is scaled based on the kernel size max_ctu3d_idx  max_ctu3d_size=(max_ctu3d_idx==0)?64:(max_ctu3d_idx==1)?32:(max_ctu3d_idx==2?16:8

TABLE 4

```
layer_header( ){
    ......
    total_sublayer_minus_one
```

TABLE 4-continued

```
    total_sublayer=1+total_sublayer_minus_one
    for(n=0;n<total_sublayer;++n){
        stepsize
        layer_stepsize.push_back(stepsize)
        bitdepth
        layer_bitdepth.push_back(bitdepth)
    }
    dim_minus_one1
    layer_dim.push_back(1+dim_minus_one1)
    shape={1,1,1,1};
    for(d=4-layer_dim[0];d<4;++d){
        ly_shape1
        shape[d]=ly_shape1
    }
    layer_shape.push_back(shape)
    include_bias
    include_scaling
    include_bn=(layer_dim[0]==1)
    shape={1,1,1,layer_shape[0][3]};
    if(include_bias){
        layer_dim.push_back(1)
        layer_shape.push_back(shape)
    }
    if(include_scaling){
        layer_dim.push_back(1)
        layer_shape.push_back(shape)
    }
    for(n=1+include_bias+include_scaling;n<total_sublayer;++n){
```

TABLE 4-continued

```
if(include_bn){
    shape={1,1,1,layer_shape[0][3]};
    layer_dim.push_back(1);
    layer_shape.push_back(shape)
}
else {
    shape={1,1,1,1 }
    dim_minus_one2
    layer_dim.push_back(1+dim_minus_one2)
    for(d=4-layer_dim[n];d<4;++d){
        ly_shape2
        shape[d]=ly_shape2
    }
    layer_shape.push_back(shape)
}
}
for(n=0;n<total_sublayer;++n){
    scan_order=0
    if(layer_dim[n]!=1)
        scan_order
    layer_scan_order.push_back(scan_order)
}
......
}
``` total_layer_minus_one total_layer=1+total_layer_minus_one stepsize stepsize of sublayer bitdepth 0max bitdepth of quantized coefficient of sublayer dim_minus_one1 first sublayer dim=1+dim_minus_one1 ly_shape1 shape of first sublayer include_bias 0 indicates bias tensor does not exist in this layer, 1 indicates bias tensor exists in this layer include_scaling 0 indicates scaling tensor does not exist in this layer, 1 indicates scaling tensor exists in this layer dim_minus_one2 sublayer dim=1+dim_minus_one2 ly_shape2 shape of sublayer scan_order 0 indicates raster scan order at horizontal direction, 1 indicates raster scan order at vertical

TABLE 5

```
array1d( ) {
    ......
    state_id=0
    for(n=0;n+21array1d_size;++n){
        q=0
        nz_flag
        if(nz_flag){
            sign
            q=TR_EGK_NZ(sign,uiMaxSigSymbol, uiEGk)
        }
        next_state=state_tab[state_id][q&1]
        if(q){
            q>>=1
            q+=(q<0)?(state_id&1):-(state_id&1)
        }
        state_id=next_state
        array1d[r]=q
    }
    ......
}
``` nzflag non-zero flag of the quantized coefficient
sign sign bit of the quantized coefficient

TABLE 6

```
ctu3d( ){
    ......
    cu3d(0,0,0)
    ......
}
```

TABLE 7

```
cu3d(depth,y_idx,x_idx){
    ......
    if(y_idx>=cu3d_height&&x_idx>=cu3d_width)
        return
    if(depth<ctu3d_depth-1){
        split_flag
        if(split_flag){
            cu3d(depth+1,(y_idx<<1),(x_idx<<1))
            cu3d(depth+1,(y_idx?+01)+1,(x_idx<<1))
            cu3d(depth+1,(y_idx<<1),(x_idx<<1)+1)
            cu3d(depth+1,(y_idx<<1)+1,(x_idx<<1)+1)
            return
        }
    }
    predicted_codebook( )
    signalled_codebook( )
    start_depth_delta
    start_depth=total_depth-1-start_depth_delta
    cbook_mode=( cbook_size!=0)
    if(!cbook_mode&&start_depth==total_depth-1)
        baseline( )
    else{
        if(cbook_mode&& enable_escape_reorder)
            cbook_esc_mode
        map_mode
        if(map_mode==0){
            uni_mode
            if(uni_mode) {
                uaflag
                unitree3d( )
            }else{
                octree3d( )
            }
        }elseif(map_mode==1){
            tgt_mode
            if(tgt_mode) {
                tagtree3d ( )
            }else{
                uaflag
                uni_tagtree3d ( )
            }
        }
        escape_rec( )
    }
    ......
}
``` split_flag: a flag to indicate if a parent CU3D is split to 4 smaller child CU3Ds start_depth_delta start_depth=total_depth-1-start_depth_delta cbook_esc_mode 0 indicates that escape is not reordered, 1 indicates that escape is reordered map_mode 0 indicates that Octree3d/Unitree3d method is selected, 1 indicates that Tagtree3d/Unitagtree3d method is selected uni_mode 0 indicates that Unitree3d method is not selected, 1 indicates that Unitree3d method is selected tgt_mode 0 indicates that Tagtree3d method is not selected, 1 indicates that Tagtree3d method is selected uaflag 0 indicates that not all coefficients are unified, 1 indicates that all coefficients are unified

TABLE 8

```
predicted_codebook( ) {
    ......
    abs_predicted_diff=TR_EGK_NN(uiMaxSigSymbol,uiEGk)
```

TABLE 8-continued

```
        if(abs_predicted_diff)
            sign
            predicted_size=(sign?-int(abs_predicted_diff):
        abs_predicted_diff)+prev_predicted_size
        for(p=0,n=0;n<max_predictor_size;++n) {
            if(p==predicted_size)
                break
            predicted_flag
            if(predicted_flag) {
                predicted[p]=n
                codebook[n]=predictor[predicted[p++]]
            }
        }
        ......
    }
``` sign sign bit of predicted_size—prev_predicted_size
predicted_flag 0 indicates that location n is not a predicted entry, 1 indicates that location n is a predicted entry

TABLE 9

```
signalled_codebook( ){
    ......
    signalled_size=0
    if(predicted_size<max_cbook_size)
        signalled_size
    cbook_size=predicted_size+signalled_size
    prev=(predicted_size)?abs(codebook[predicted_size-1]):0
    for(n=predicted_size;n<cbook_size;n++){
        delta=exist=0
        if(n>=2)
            for(m=0;m<n-1;m++)
                if(abs_codebook[m]==abs_codebook[n-1])
                    exist=1
        if (exist)
            nzflag_delta=1
        else
            nzflag_delta
        if(nzflag_delta){
            sign_delta
            delta=TR_EGK_NZ(sign_delta, ,uiMaxSigSymbol,uiEGk)
        }
        abs_codebook[n]=delta+prev
```

TABLE 9-continued

```
        prev=abs_codebook[n]
    }
    for(n=predicted_size;n<cbook_size;n++){
        sign
        codebook[n]=(sign?-int(abs_codebook[n]):abs_codebook[n])
    }
    ......
}
``` signalled_size signalled codebook size
nzflag_delta non-zero flag of delta
sign_delta sign bit of delta
sign sign bit of codebook entry

TABLE 10

```
baseline( ) {
    ......
    state_id=0
    for(y=0;y<cu3d_height;++y){
        for(x=0;x<cu3d_width;++x){
            for(z=0;z<cu3d_length;++z){
                q=0
                nz_flag
                if(nz_flag){
                    sign
                    q=TR_EGK_NZ(sign,uiMaxSigSymbol, uiEGk)
                }
                next_state=state_tab[state_id][q&1]
                if(q){
                    q<<=1
                    q+=(q<0)?(state_id&1):(state_id&1)
                }
                state_id=next_state
                map[z][y][x]=q
            }
        }
    }
    ......
}
``` nzflag non-zero flag of the quantized coefficient
sign sign bit of the quantized coefficient

TABLE 11

```
unitree3d( ){
    ......
    state_id=0
    for(d=start_depth;d<total_depth;++d){
        first_depth=(d==start_depth)
        last_depth=(d==total_depth-1)
        for(by=0;by<height[d];by+=2){
            for(bx=0;bx<width[d];bx+=2){
                for(bz=0;bz<length[d];bz+=2){
                    lt=min(2,length-bz)
                    ht=min(2,height-by)
                    wt=min(2,width-bx)
                    for(y=by;y<by+ht;++y){
                        for(x=bx;x<bx+wt;++x){
                            for(z=bz;z<bz+lt;++z){
                                first_coef=((z&1)==0&&(y&1)==0&&(x&1)==0);
    skip_cube=!start_last_depth&&!first_depth&&(last_depth | | !utree[d-1][z>>1][y>>1][x>>1]);
                                skip_start_last=(start_last_depth&&!first_coef);
                                skip_depth=(uaflag&&d>=total_depth-2);
                                if(skip_depth)
                                    utree[d][z][y][x]=0;
                                else if(skip_cube)
                                    utree[d][z][y][x]=utree[d-1][z>>1][y>>1][x>>1];
                                else if(skip_start_last)
                                    utree[d][z][y][x]=utree[d][z&(~1)][y&(~1)][x&(~1)];
                                else{
                                    uni_flag
```

TABLE 11-continued

```
                    utree[d][z][y][x]=uni_flag
                  }
                  uniflag=!!utree[d][z][y][x];
                  if((!start_last_depth&&!last_depth&&!uniflag) ||
                     (!start_last_depth&&last_depth&&!utree[d-
1][z>>1][y>>1][x>>1]) ||
                     (start_last_depth&&(uniflag || first_coef))){
                     map_z=(z<<(total_depth-1-d));
                     map_y=(y<<(total_depth-1-d));
                     map_x=(x<<(total_depth-1-d));
                     q=0
                     nzflag
                     if(nzflag){
                        if(cbook_size)
                           q=TR_EGK_NZ(0,uiMaxSigSymbol,uiEGk)
                        else
                           q=TR_EGK_NZ(0,uiMaxSigSymbol,uiEGk)
                     }
                     next_state=state_tab[state_id][q&1]              optional
                     if(q){                                            optional
                        q<<=1                                          optional
                        q+=(q<0)?(state_id&1):(state_id&1)             optional
                     }                                                 optional
                     state_id=next_state                               optional
                     map[map_z][map_y][map_x]=q
                  }else if(last_depth){
                     d0=d;
                     while(d0>start_depth){
                        delta=total_depth-d0;
                        if(!!utree[d0-1][z>>delta][y>>delta][x>>delta])
                           break;
                        --d0;
                     }
                     mask=~((1<<(total_depth-d0-!start_last_depth))-1);
                     map[z][y][x]=abs(map[z&mask][y&mask][x&mask]);
                  }
                  if(last_depth&&map[z][y][x]&&!cbook_size){
                     sign
                     map[z][y][x]=(sign)?-int(map[z][y][x]):map[z][y][x];
                  }
               }
             }
           }
         }
       }
     }
   }
   ......
}
``` uni_flag utree node value
nzflag non-zero flag of the quantized coefficient
sign sign bit of the quantized coefficient

TABLE 12

```
octree3d( ){
   ......
   state_id=0
   for(d=start_depth;d<total_depth;++d){
      first_depth=(d==start_depth)
      last_depth=(d==total_depth-1)
      for(by=0;by<height[d];by+=2){
      for(bx=0;bx<width[d];bx+=2){
         for(bz=0;bz<length[d];bz+=2){
            lt=min(2,length-bz)
            ht=min(2,height-by)
            wt=min(2,width-bx)
            for(y=by;y<by+ht;++y){
               for(x=bx;x<bx+wt;++x){
                  for(z=bz;z<bz+lt;++z){
                     skip_cube=!first_depth&&!oct[d-1][z>>1][y>>1][x>>1]
                     check_last=!first_depth&&oct[d-1][z>>1][y>>1][x>>1]
                     last_coef=(y==by+ht-1&&x == bx+wt-1&&z == bz+lt-1)
                     skip_last=(check_last&&last_coef)?(max(coef)!=oct[d-
1][z>>1][y>>1][x>>1]):0
                     if(!skip_cube&&!skip_last){
```

TABLE 12-continued

```
                    oct_flag
                    oct[d][z][y][x]=oct_flag
                }else
                    oct[d][z][y][x]=oct[d-1][z>>1][y>>1][x>>1]
                nzflag=oct[d][z][y][x]
                if(last_depth){
                    q=0
                    if(nzflag){
                        if(cbook_size)
                            q=TR_EGK_NZ(0,uiMaxSigSymbol,uiEGk)
                        else{
                            sign
                            q=TR_EGK_NZ(sign,uiMaxSigSymbol, uiEGk)
                        }
                    }
                    next_state=state_tab[state_id][q&1]          optional
                    if(q){                                        optional
                        q<<=1                                     optional
                        q+=(q<0)?(state_id&1):(state_id&1)        optional
                    }                                             optional
                    state_id=next_state                           optional
                    map[z][y][x]=q
                }
                coef.push_back(oct[d][z][y][x])
            }
        }
    }
  }
 }
}
 ......
}
``` oct_flag octree node value
sign sign bit of the quantized coefficient

TABLE 13

```
tagtree3d( ){
  ......
  state_id=0
  for(d=start_depth;d<total_depth;++d){
    first_depth=(d==start_depth)
    last_depth=(d==total_depth-1)
    for(by=0;by<height[d];by+=2){
      for(bx=0;bx<width[d];bx+=2){
        for(bz=0;bz<length[d];bz+=2){
          lt=min(2,length-bz)
          ht=min(2,height-by)
          wt=min(2,width-bx)
          for(y=by;y<by+ht;++y){
            for(x=bx;x<bx+wt;++x){
              for(z=bz;z<bz+lt;++z){
                prev_coef=(first_depth)?0:tgt[d-1][z >> 1][y >> 1][x >> 1]
                last_coef=(y==by+ht-1&&x==bx+wt-1&&z==bz+lt-1)
                skip_last=(!first_depth&&last_coef?(min(coef)!=prev_coef):0
                tgt[d][z][y][x]=prev_coef
                if (!skip_last) {
                  nz_flag;
                  if (nz_flag) {
                    if (cbook_size)
                      tgt[d][z][y][x]+=TR_EGK_NZ(0,uiMaxSigSymbol,uiEGk)
                    else
                      tgt[d][z][y][x]+=TR_EGK_NZ(0,uiMaxSigSymbol,uiEGk)
                  }
                }
                if (last_depth&&tgt[d][z][y][x]&&!cbook_size) {
                  sign
                  tgt[d][z][y][x]=(sign)?-int(tgt[d][z][y][x]):tgt[d][z][y][x]
                }
                if (last_depth){
                  q=tgt[d][z][y][x]
                  next_state=state_tab[state_id][q&1]          optional
                  if(q){                                        optional
                    q<<=1                                       optional
                    q+=(q<0)?(state_id&1):(state_id&1)          optional
```

TABLE 13-continued

```
            }                                                     optional
            state_id=next_state                                   optional
            map[z][y][x]=q
          }
          coef.push_back(abs(tgt[d][z][y][x]))
        }
       }
      }
     }
    }
   }
  }
 }
 ......
}
```

15 nz_flag non-zero flag of node value
sign sign bit of quantized coefficient

TABLE 14

```
uni_tagtree3d( ){
  ......
  state_id=0
  for(d=start_depth;d<total_depth;++d){
    first_depth=(d==start_depth)
    last_depth=(d==total_depth-1)
    for(by=0;by<height[d];by+=2){
      for(bx=0;bx<width[d];bx+=2){
        for(bz=0;bz<length[d];bz+=2){
          lt=min(2,length-bz)
          ht=min(2,height-by)
          wt=min(2,width-bx)
          for(y=by;y<by+ht;++y){
            for(x=bx;x<bx+wt;++x){
              for(z=bz;z<bz+lt;++z){
                prev_coef=(first_depth)?0:tgt[d-1][z>>1][y>>1][x>>1]
                last_coef=(y==by+ht-1&&x==bx+wt-1&&z==bz+lt-1)
                skip_last=(!first_depth&&last_coef)?(min(coef)!=prev_coef):0
                first_coef=((z&1)==0&&(y&1)==0&&(x&1)==0)
skip_cube=!start_last_depth&&!first_depth&&(last_depth || !utree[d-
1][z>>1][y>>1][x>>1])
                skip_start_last=(start_last_depth&&!first_coef)
                skip_depth=(uaflag&&d >= total_depth-2)
                if(skip_depth)
                  utree[d][z][y][x]=0
                else if(skip_cube)
                  utree[d][z][y][x]=utree[d-1][z>>1][y>>1][x>>1]
                else if(skip_start_last)
                  utree[d][z][y][x]=utree[d][z & (~1)][y & (~1)][x & (~1)]
                else{
                  uni_flag
                  utree[d][z][y][x]=uni_flag
                }
if(!skip_last&&(!start_last_depth || (!utree[d][z][y][x] || first_coef))){
                  tgt[d][z][y][x]=prev_coef
                  nz_flag
                  if(nz_flag){
                    if(cbook_size)
                      tgt[d][z][y][x]+=TR_EGK_NZ(0,uiMaxSigSymbol,uiEGk)
                    else
                      tgt[d][z][y][x]+=TR_EGK_NZ(0,uiMaxSigSymbol,uiEGk)
                  }
                }
                else if(skip_last)
                  tgt[d][z][y][x]=prev_coef
                else
                  tgt[d][z][y][x]=abs(tgt[d][z & ~1][y & ~1][x & ~1])
                if(last_depth&&tgt[d][z][y][x]&&!cbook_size){
                  sign
                  tgt[d][z][y][x]=(sign)?-int(tgt[d][z][y][x]):tgt[d][z][y][x]
                }
                if(last_depth)
                  q=tgt[d][z][y][x]
                  next_state=state_tab[state_id][q&1]             optional
                  if(q){                                          optional
                    q<<=1                                         optional
                    q+=(q<0)?(state_id&1):(state_id&1)            optional
```

TABLE 14-continued

```
            }
                state_id=next_state                    optional
                map[z][y][x]=q                        optional
            }
            coef.push_back(abs(tgt[d][z][y][x]))
          }
        }
      }
    }
  }
}
``` uni_flag utree node value
nz_flag non-zero flag of node value
sign sign bit of quantized coefficient

TABLE 15

```
escape_rec( ){
  ......
  escape_index=(cbook_esc_mode)?cbook_size:0
  for(z=0;z<cu3d_length;++z){
    for(y=0;y<cu3d_height;++y){
      for(x=0;x<cu3d_width;++x){
        if(cbook_size){
          if(map[z][y][x]== escape_index)
            q=0
            nz_flag
            if(nz_flag){
              sign
              q=TR_EGK_NZ(sign,uiMaxSigSymbol, uiEGk)
            }
          else{
            q=(cbook_esc_mode)?codebook[map[z][y][x]]:
codebook[map[z][y][x]-1]
          }
        }else{
          q=map[z][y][x]
        }
        recon_value=dequant(q)
      }
    }
  }
  ......
}
``` nz_flag non-zero flag of node value
sign sign bit of quantized coefficient

TABLE 16

```
TR_EGK_NN(uiMaxSigSymbol, uiEGk){
  nz_flag
  if(!nz_flag)
    return 0
  cnt=1
  uiSymbol=0
  nzflag=0
  do{
    nzf lag
    uiSymbol++
    if(++cnt>uiMaxSigSymbol)
      break
  }while(nzflag)
  ruiSymbol=uiSymbol
  if(!nzflag)
    return ruiSymbol
  ++ruiSymbol
  uiBit=1
  uiSymbol=0
  while(uiBit){
    uiBit_pre
    uiSymbol+=uiBit_pre<<uiEGk
    ++uiEGk
```

TABLE 16-continued

```
  }
  --uiEGk
  while(uiEGk--){
    uiBit
    uiSymbol+=uiBit<<uiEGk
  }
  ruiSymbol+=uiSymbol
  return ruiSymbol
}
``` nz_flag non-zero flag
nzflag non-zero flag
uiBit_pre unary part of the exponential golomb remainder
uiBit bit of EGk

TABLE 17

```
TR_EGK_NZ(sign, uiMaxSigSymbol, uiEGk){
  cnt=1
  uiSymbol=0
  nzflag
  do{
    nzflag
    uiSymbol++
    if(++cnt>uiMaxSigSymbol)
      break
  }while(nzflag)
  ruiSymbol=uiSymbol
  riSymbol=(sign)?-int(ruiSymbol):int(ruiSymbol)
  if(! nzflag)
    return riSymbol
  ++ruiSymbol
  uiBit=1
  uiSymbol=0
  while(uiBit){
    uiBit
    uiSymbol+=uiBit<<uiEGk
    ++uiEGk
  }
  --uiEGk
  if(uiEGk) {
    uiBits
    uiSymbol+=uiBits
  }
  ruiSymbol+=uiSymbol
  riSymbol=(sign)?-int(ruiSymbol):int(ruiSymbol)
  return riSymbol
}
``` nzflag non-zero flag
uiBit unary part of the exponential golomb remainder
uiBits fixed length remainder Appendix C: Syntax Tables of Unification Based Coding

TABLE 18

| | Descriptor |
|---|---|
| quant_tensor( dimensions, maxNumNoRem) {<br>  layer_uniform =0<br>  layerWidth = Prod( dimensions ) / dimensions[0]<br>  kernel_size = (Ndim(dimensions) == 1) ? 1 : layerWidth / dimensions[1]<br>  if((kernel_size != 1 \|\| layerWidth != 1) && (dq_flag == 0) && (scan_order != 0))<br>    layer_uniform_flag<br>  if( layer_uniform )<br>    quant_tensor_uniform( dimensions, maxNumNoRem)<br>  else<br>    quant_tensor_baseline( dimensions, maxNumNoRem)<br>} | <br><br><br><br><br>ae(v) |

Ndim(arrayName[ ]) returns the number of dimension of arrayName[ ].

scan_order specifies the block scanning order for parameters with more than one dimension according to the following table:
  0: No block scanning
  1: 8×8 blocks
  2: 16×16 blocks
  3: 32×32 blocks
  4: 64×64 blocks layer_uniform_flag specifies whether the quantized weight QuantParam[ ] is encoded using uniform method. A layer_uniform_flag equal to 1 indicates that QuantParam[ ] is encoded using uniform method.

TABLE 19

| | Descriptor |
|---|---|
| quant_tensor_baseline( dimensions, maxNumNoRem) {<br>  stateId = 0 | |

TABLE 19-continued

| | Descriptor |
|---|---|
| for( i = 0; i < Prod( dimensions); i++ ) {<br>  idx = TensorIndex( dimensions, i, scan_order )<br>  int_param( idx, maxNumNoRem, stateId )<br>  if(dq_flag) {<br>    nextSt = StateTransTab[stateId][QuantParam[idx] & 1]<br>    if( QuantParam[idx]!= 0) {<br>      QuantParam[idx] = QuantParam[idx] << 1<br>      QuantParam[idx] += QuantParam[idx] < 0 ?<br>        ( stateId & 1 ) : − ( stateId & 1)<br>    }<br>    stateId = nextSt<br>  }<br>} | |

The 2D integer array StateTransTab[ ][ ] specifies the state transition table for dependent scalar quantization and is as follows:
  StateTransTab[ ][ ]={0, 2}, {7, 5}, {1, 3}, {6, 4}, {2, 0}, {5, 7}, {3, 1}, {4, 6}

TABLE 20

| | Descriptor |
|---|---|
| quant_tensor_uniform( dimensions, maxNumNoRem) {<br>  layerWidth = Prod( dimensions ) / dimensions[0]<br>  kernel_size = (Ndim(dimensions) == 1) ? 1 : layerWidth / dimensions[1]<br>  layer_width = layerWidth / kernel_size<br>  layer_height = dimensions[0]<br>  block_height = block_width = (4 << scan_order)<br>  for ( ly = 0; ly < layer_height; ly += block_height) {<br>  for ( lx = 0; lx < layer_width; lx += block_width) {<br>    stateId = 0<br>    scanIterator = 0<br>    level_uniform[ ]<br>    ctu3d_width =min(block_width, layer_width - lx);<br>    ctu3d_height =min(block_height, layer_height - ly);<br>    ctu3d_uniform_flag<br>    for ( by = 0; by < ctu3d_height; by += 2) {<br>      for ( bx = 0; bx < ctu3d_width; bx += 2) {<br>        for ( bz = 0; bz < kernel_size; bz += 2) {<br>        lt =min(2, kernel_size - bz);<br>        ht = min(2, ctu3d_height - by);<br>        wt =min(2, ctu3d_width - bx);<br>        for ( y = 0; y < ht; ++y) {<br>          for ( x = 0; x < wt; ++x) {<br>            for ( z = 0; z < lt; ++z) {<br>              if(ctu3d_uniform_flag && (x != 0 \|\| y != 0 \|\| z != 0))<br>                continue<br>              int_param( 0, maxNumNoRem, stateId )<br>              if(dq_flag) {<br>                nextSt = StateTransTab[stateId][QuantParam[idx]& 1]<br>                if( QuantParam[0] != 0) {<br>                  QuantParam[0] = QuantParam[0]<< 1 | <br><br><br><br><br><br><br><br><br><br><br><br><br>ae(v) |

TABLE 20-continued

| | Descriptor |
|---|---|
| ``` | |
|                 QuantParam[0] += QuantParam[0] < 0 ? | |
|                   ( stateId & 1 ) : − ( stateId & 1 ) | |
|                }  | |
|                stateId = nextSt | |
|              } | |
|              level_uniform[scanIterator++] = QuantParam[0] | |
|            } | |
|          } | |
|        } | |
|      } | |
|    } | |
|  } | |
|  scanIterator = 0 | |
|  for ( by = 0; by < ctu3d_height; by += 2) { | |
|    for ( bx = 0; bx < ctu3d_width; bx += 2) { | |
|      for ( bz = 0; bz < kernel_size; bz += 2) { | |
|        lt =min(2, kernel_size - bz); | |
|        ht =min(2, ctu3d_height - by); | |
|        wt =min(2, ctu3d_width - bx); | |
|        for ( y = 0; y < ht; ++y) { | |
|          for ( x = 0; x < wt; ++x) { | |
|            for ( z = 0; z < lt; ++z) { | |
|              idx = (ly + by + y) * layerWidth + | |
|                (lx + bx + x) * kernel_size + bz + z; | |
|              sign = 0 | |
|              if(level_uniform[scanIterator]) | |
|                sign | ae(v) |
|              sign = (sign) ? -1 : 1; | |
|              QuantParam[idx]= sign * level_uniform[scanIterator]; | |
|              if(ctu3d_uniform_flag == 0) | |
|                scanIterator++; | |
|            } | |
|          } | |
|        } | |
|        if(ctu3d_uniform_flag) | |
|          scanIterator++; | |
|      } | |
|    } | |
|  } | |
| } | | ctu3d_uniform_flag specifies whether the quantized CTU3D weight QuantParam[ ] is encoded using uniform method. A ctu3d_uniform_flag equal to 1 indicates that QuantParam[ ] is encoded using uniform method.

sign_flag specifies whether the quantized weight QuantParam[i] is positive or negative. A sign_flag equal to 1 indicates that QuantParam[i] is negative.

TABLE 21

| | Descriptor |
|---|---|
| int_param( i, maxNumNoRem, stateId ) { | |
|   QuantParam[i] = 0 | |
|   sig_flag | ae(v) |
|   if( sig_flag ) { | |
|     QuantParam[i]++ | |
|     sign_flag | ae(v) |
|     j = −1 | |
|     do { | |
|       j++ | |
|       abs_level_greater_x[j] | ae(v) |
|       QuantParam[i]+= abs_level_greater_x[j] | |
|     } while( abs_level_greater_x[j]== 1 && j < maxNumNoRem ) | |
|     if( j == maxNumNoRem ) { | |
|       RemBits = 0 | |
|       j = −1 | |
|       do { | |
|         j++ | |
|         abs_level_greater_x2[j] | ae(v) |
|         if( abs_level_greater_x2[j]) { | |

TABLE 21-continued

|  | Descriptor |
|---|---|
| `        RemBits++` |  |
| `        QuantParam[i] += 1 << RemBits` |  |
| `      }` |  |
| `    } while( abs_level_greater_x2[j] && j < 30 )` |  |
| `    abs_remainder` | uae(RemBits) |
| `    QuantParam[i] += abs_remainder` |  |
| `  }` |  |
| `  QuantParam[i] = sign_flag ? ? −QuantParam[i]:` |  |
| `        QuantParam[i]` |  |
| `  }` |  |
| `}` |  | sig_flag specifies whether the quantized weight QuantParam[i] is nonzero. A sig_flag equal to 0 indicates that QuantParam[i] is zero.

sign_flag specifies whether the quantized weight QuantParam[i] is positive or negative. A sign_flag equal to 1 indicates that QuantParam[i] is negative.

abs_level_greater_x[j] indicates whether the absolute level of QuantParam[i] is greater j+1.

abs_level_greater_x2[j] comprises the unary part of the exponential golomb remainder.

abs_remainder indicates a fixed length remainder.

What is claimed is:

1. A method of neural network decoding at a decoder, comprising:
    receiving a first syntax element in a compressed neural network representation (NNR) aggregate unit header of an NNR aggregate unit from a bitstream of a compressed neural network representation of a neural network, the first syntax element indicating a coding tree unit (CTU) scan order for processing a tensor in the NNR aggregate unit; and
    reconstructing the tensor in the NNR aggregate unit based on the CTU scan order indicated by the first syntax element.

2. The method of claim 1, wherein a first value of the first syntax element indicates that the CTU scan order is a first raster scan order at a horizontal direction, and a second value of the first syntax element indicates that the CTU scan order is a second raster scan order at a vertical direction.

3. The method of claim 1, further comprising:
    receiving a second syntax element in the NNR aggregate unit header of the NNR aggregate unit from the bitstream, the second syntax element indicating a maximum bit depth of quantized coefficients for the tensor in the NNR aggregate unit.

4. The method of claim 1, further comprising:
    receiving a third syntax element indicating whether a CTU block partitioning is enabled for the tensor in the NNR aggregate unit.

5. The method of claim 4, wherein the third syntax element is a model-wise syntax element to specify whether the CTU block partitioning is enabled for layers of the neural network, or a tensor-wise syntax element to specify whether the CTU block partitioning is enabled for the tensor in the NNR aggregate unit.

6. The method of claim 1, further comprising:
    receiving a model-wise or tensor-wise fourth syntax element indicating a CTU dimension for the tensor in the NNR aggregate unit.

7. The method of claim 1, further comprising:
    receiving an NNR unit before receiving any NNR aggregate units, the NNR unit including a fifth syntax element indicating whether CTU partitioning is enabled.

8. A method of neural network decoding at a decoder, comprising:
    receiving, from a bitstream of a compressed neural network representation, one or more first syntax elements associated with a 3-dimensional coding unit (CU3D) partitioned from a first 3-dimensional coding tree unit (CTU3D), the first CTU3D being partitioned from a tensor in a neural network, the one or more first syntax elements indicating that the CU3D is partitioned based on a 3D pyramid structure that includes multiple depths, each depth corresponding to one or more nodes, each node having a node value;
    receiving second syntax elements corresponding to the node values of the nodes in the 3D pyramid structure, the second syntax elements being received from the bitstream in a breadth-first scan order for scanning the nodes in the 3D pyramid structure; and
    reconstructing model parameters of the tensor based on the received second syntax elements corresponding to the node values of the nodes in the 3D pyramid structure.

9. The method of claim 8, wherein the 3D pyramid structure is one of an octree structure, a unitree structure, a tagtree structure, or a unitagtree structure.

10. The method of claim 8, wherein the receiving of the second syntax elements starts from a start depth of the depths of the 3D pyramid structure, the start depth being indicated in the bitstream or inferred at the decoder.

11. The method of claim 8, further comprising:
    receiving a third syntax element indicating a start depth for the receiving of the second syntax elements indicating the node values of the nodes in the 3D pyramid structure; and
    when the start depth is the last depth of the 3D pyramid structure, decoding the model parameters of the tensor from the bitstream using a non-3D-pyramid-tree-based decoding method.

12. The method of claim 8, further comprising:
    receiving a third syntax element indicating a start depth for the receiving of the second syntax elements indicating the node values of the nodes in the 3D pyramid structure,
    wherein when the start depth is the last depth of the 3D pyramid structure, the receiving the second syntax elements starts from the second last depth of the depths of the 3D pyramid structure.

13. The method of claim 8, further comprising:
receiving a third syntax element indicating a start depth for the receiving of the second syntax elements indicating the node values of the nodes in the 3D pyramid structure,
wherein when the start depth is the last depth of the 3D pyramid structure and the 3D pyramid structure is a unitagtree structure associated with unitree part encoding and tagtree part encoding,
for the unitree part encoding, the receiving the second syntax elements starts from the second last depth of the depths of the 3D pyramid structure, and
for the tagtree part encoding, the receiving the second syntax elements starts from the last depth of the depths of the 3D pyramid structure.

14. The method of claim 8, further comprising:
disabling dependent quantization when the one or more first syntax elements indicate that the CU3D is partitioned based on the 3D pyramid structure.

15. The method of claim 8, further comprising:
performing a dependent quantization construction process when the one or more first syntax elements indicate that the CU3D is partitioned based on the 3D pyramid structure, wherein model parameters of the tensor that are skipped during an encoding process based on the 3D pyramid structure are excluded from the dependent quantization construction process.

16. The method of claim 8, further comprising:
receiving a fourth syntax element associated with the CU3D indicating whether all model parameters of the CU3D are unified.

17. The method of claim 8, further comprising:
using a zero value as a value of a prior neighbor of a first coefficient in a kernel of the tensor for determining a context model for entropy decoding the first coefficient in the kernel.

18. The method of claim 8, further comprising:
receiving one or more fifth syntax elements indicating a width or a height of a second CTU3D of the tensor in the bitstream; and
determining to decode model parameters of the second CTU3D based on a baseline coding method when the width, the height, or both the width and height are 1 model parameter.

19. A method of neural network decoding at a decoder, comprising:
receiving a first syntax element associated with a 3-dimensional coding tree unit (CTU3D) partitioned from a tensor in a layer of a neural network in a bitstream of a compressed neural network representation of the neural network, the first syntax element indicating whether all child nodes at a bottom depth of a pyramid tree structure associated with the CTU3D are unified; and
decoding the CTU3D based on a 3-dimensional-unitree (3D-unitree) coding method when the first syntax element indicates that all child nodes at the bottom depth of the pyramid tree structure associated with the CTU3D are unified.

20. The method of claim 19, further comprising:
receiving a second syntax element associated with the layer of the neural network in the bitstream, the second syntax element indicating whether the layer is encoded using a pyramid tree structure based coding method.

21. The method of claim 19, wherein the child nodes at the bottom depth that do not share a same parent node have different unification values.

22. The method of claim 19, further comprising:
inferring a start depth of the 3D-unitree coding method to be the bottom depth of the pyramid tree structure.

23. The method of claim 19, wherein unification flags of nodes at the bottom depth of the pyramid tree structure are not encoded in the bitstream.

24. The method of claim 19, further comprising:
receiving a unification value that is encoded in the bitstream for all child nodes at the bottom depth that share a same parent node; and
receiving sign bits of all the child nodes at the bottom depth that share the same parent node, the sign bits following the unification value in the bitstream.

25. The method of claim 19, further comprising:
receiving from the bitstream a unification value for each group of child nodes at the bottom depth that share a same parent node; and
receiving sign bits of the child nodes in each group of the child nodes at the bottom depth that share the same parent node.

26. The method of claim 19, further comprising:
responsive to the first syntax element indicates not all child nodes at the bottom depth of the pyramid tree structure associated with the CTU3D are unified, decoding the CTU3D based on a 3-dimensional-tagtree (3D-tagtree) coding method.

27. The method of claim 26, further comprising:
inferring a start depth of the 3D-tagtree coding method to be the bottom depth of the pyramid tree structure.

28. The method of claim 27, further comprising:
decoding values of the nodes at the bottom depth of the pyramid tree structure according to one of:
receiving the values of the nodes at the bottom depth of the pyramid tree structure each encoded in the bitstream based on a predefined scan order,
receiving an absolute value followed by a sign, if the absolute value is non-zero, for each of the nodes at the bottom depth of the pyramid tree structure in the bitstream based on a predefined scan order, or
receiving an absolute value for each of the nodes at the bottom depth of the pyramid tree structure in the bitstream based on a predefined scan order followed by receiving a sign for each of the nodes, if the node has a non-zero value, at the bottom depth of the pyramid tree structure in the bitstream based on a predefined scan order.

\* \* \* \* \*